United States Patent
Koduri

(10) Patent No.: US 12,489,067 B2
(45) Date of Patent: Dec. 2, 2025

(54) INDUSTRIAL CHIP SCALE PACKAGE FOR MICROELECTRONIC DEVICE

(71) Applicant: Texas Instruments Incorporated, Dallas, TX (US)

(72) Inventor: Sreenivasan K Koduri, Dallas, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 18/461,478

(22) Filed: Sep. 5, 2023

(65) Prior Publication Data

US 2024/0162163 A1 May 16, 2024

Related U.S. Application Data

(63) Continuation of application No. 16/042,661, filed on Jul. 23, 2018, now Pat. No. 11,749,616.

(Continued)

(51) Int. Cl.
*H01L 23/552* (2006.01)
*H01L 23/00* (2006.01)
*H01L 23/488* (2006.01)

(52) U.S. Cl.
CPC ......... *H01L 23/552* (2013.01); *H01L 23/488* (2013.01); *H01L 24/03* (2013.01);
(Continued)

(58) Field of Classification Search
CPC ..... H01L 23/552; H01L 23/488; H01L 24/03; H01L 24/05; H01L 24/11; H01L 24/13;
(Continued)

(56) References Cited

U.S. PATENT DOCUMENTS

| 6,114,187 A | 9/2000 | Hayes |
| 8,021,921 B2 | 9/2011 | Lin et al. |

(Continued)

FOREIGN PATENT DOCUMENTS

| CN | 1208947 A | 2/1999 |
| CN | 101038904 A | 9/2007 |

(Continued)

OTHER PUBLICATIONS

International Search Report dated Jan. 31, 2019, International Application No. PCT/US2018/054422, 3 pages.

(Continued)

*Primary Examiner* — Jonathan Han
(74) *Attorney, Agent, or Firm* — Xiaotun Qiu; Frank D. Cimino

(57) ABSTRACT

A microelectronic device includes a die with input/output (I/O) terminals, and a dielectric layer on the die. The microelectronic device includes electrically conductive pillars which are electrically coupled to the I/O terminals, and extend through the dielectric layer to an exterior of the microelectronic device. Each pillar includes a column electrically coupled to one of the I/O terminals, and a head contacting the column at an opposite end of the column from the I/O terminal. The head extends laterally past the column in at least one lateral direction. Methods of forming the pillars and the dielectric layer are disclosed.

18 Claims, 17 Drawing Sheets

Related U.S. Application Data

(60) Provisional application No. 62/568,340, filed on Oct. 5, 2017.

(52) U.S. Cl.
CPC .............. *H01L 24/05* (2013.01); *H01L 24/11* (2013.01); *H01L 24/13* (2013.01); *H01L 24/16* (2013.01); *H01L 24/95* (2013.01); *H01L 2224/03318* (2013.01); *H01L 2224/0401* (2013.01); *H01L 2224/05006* (2013.01); *H01L 2224/05007* (2013.01); *H01L 2224/05025* (2013.01); *H01L 2224/0508* (2013.01); *H01L 2224/05147* (2013.01); *H01L 2224/05155* (2013.01); *H01L 2224/05166* (2013.01); *H01L 2224/05186* (2013.01); *H01L 2224/05558* (2013.01); *H01L 2224/05562* (2013.01); *H01L 2224/05568* (2013.01); *H01L 2224/05655* (2013.01); *H01L 2224/11312* (2013.01); *H01L 2224/1146* (2013.01); *H01L 2224/11472* (2013.01); *H01L 2224/1191* (2013.01); *H01L 2224/13012* (2013.01); *H01L 2224/13017* (2013.01); *H01L 2224/13018* (2013.01); *H01L 2224/13022* (2013.01); *H01L 2224/13111* (2013.01); *H01L 2224/13113* (2013.01); *H01L 2224/13139* (2013.01); *H01L 2224/13147* (2013.01); *H01L 2224/13562* (2013.01); *H01L 2224/1357* (2013.01); *H01L 2224/13618* (2013.01); *H01L 2224/13655* (2013.01); *H01L 2224/13657* (2013.01); *H01L 2224/13664* (2013.01); *H01L 2224/13666* (2013.01); *H01L 2224/13669* (2013.01); *H01L 2224/1368* (2013.01); *H01L 2224/13681* (2013.01); *H01L 2224/13684* (2013.01); *H01L 2224/1403* (2013.01); *H01L 2224/16058* (2013.01); *H01L 2224/16227* (2013.01); *H01L 2224/17107* (2013.01); *H01L 2224/32227* (2013.01); *H01L 2224/81193* (2013.01); *H01L 2224/81815* (2013.01); *H01L 2224/83193* (2013.01)

(58) Field of Classification Search
CPC ...................... H01L 24/16; H01L 24/95; H01L 2224/03318; H01L 2224/0401; H01L 2224/05006; H01L 2224/05007; H01L 2224/05025; H01L 2224/0508; H01L 2224/05147; H01L 2224/05155; H01L 2224/05166; H01L 2224/05186; H01L 2224/05558; H01L 2224/05562; H01L 2224/05568; H01L 2224/05655; H01L 2224/11312; H01L 2224/1146; H01L 2224/11472; H01L 2224/1191; H01L 2224/13012; H01L 2224/13017; H01L 2224/13018; H01L 2224/13022; H01L 2224/13111; H01L 2224/13113; H01L 2224/13139; H01L 2224/13147; H01L 2224/13562; H01L 2224/1357; H01L 2224/13618; H01L 2224/13655; H01L 2224/13657; H01L 2224/13664; H01L 2224/13666; H01L 2224/13669; H01L 2224/1368; H01L 2224/13681; H01L 2224/13684; H01L 2224/1403; H01L 2224/16058; H01L 2224/16227; H01L 2224/17107; H01L 2224/32227; H01L 2224/81193; H01L 2224/81815; H01L 2224/83193; H01L 2924/00014; H01L 2924/01074; H01L 2924/04953; H01L 2924/04941; H01L 2924/014; H01L 2924/00012; H01L 2224/05022

See application file for complete search history.

(56) References Cited

U.S. PATENT DOCUMENTS

| | | | |
|---|---|---|---|
| 8,421,222 | B2 | 4/2013 | Lin et al. |
| 8,698,307 | B2 | 4/2014 | Shih et al. |
| 9,369,175 | B2 | 6/2016 | Lee et al. |
| 9,425,136 | B2 | 8/2016 | Kuo et al. |
| 9,496,233 | B2 | 11/2016 | Lin et al. |
| 9,646,923 | B2 | 5/2017 | Tseng et al. |
| 2002/0190107 | A1 | 12/2002 | Shah et al. |
| 2004/0130034 | A1 | 7/2004 | Alvarez |
| 2007/0190341 | A1 | 8/2007 | Furuya et al. |
| 2009/0057896 | A1 | 3/2009 | Su |
| 2013/0187270 | A1 | 7/2013 | Yu et al. |
| 2013/0270699 | A1* | 10/2013 | Kuo .................. H01L 24/16 257/737 |
| 2014/0061888 | A1* | 3/2014 | Lin .................. H01L 21/565 438/118 |
| 2015/0200166 | A1 | 7/2015 | Kono et al. |
| 2017/0285280 | A1* | 10/2017 | Seidemann ............ G02B 6/428 |

FOREIGN PATENT DOCUMENTS

| | | |
|---|---|---|
| CN | 101128931 | 2/2008 |
| CN | 101383292 | 3/2009 |
| CN | 102386158 A | 3/2012 |
| CN | 103219309 | 7/2013 |
| CN | 103681606 | 3/2014 |
| CN | 106409728 | 2/2017 |
| JP | 2011035296 | 2/2011 |
| WO | 03/023855 | 3/2003 |

OTHER PUBLICATIONS

Written Opinion dated Jan. 31, 2019, International Application No. PCT/US2018/054422, 4 pages.
CN Office Action mailed Jan. 5, 2023.
CNIP Office Action mailed Feb. 10, 2025, 2 pgs.
CNIP Office Action mailed Jul. 24, 2025, 5 pgs.

\* cited by examiner

_US 12,489,067 B2_

INDUSTRIAL CHIP SCALE PACKAGE FOR MICROELECTRONIC DEVICE

CROSS-REFERENCE TO RELATED APPLICATIONS

This application is a continuation to U.S. patent application Ser. No. 16/042,661, filed Jul. 23, 2018, which claims the benefit of priority under 35 U.S.C. § 119(e) of U.S. Provisional Application No. 62/568,340, filed Oct. 5, 2017, which is hereby incorporated by reference in its entirety.

FIELD OF THE DISCLOSURE

This disclosure relates to the field of microelectronic devices. More particularly, this disclosure relates to chip scale packaging in microelectronic devices.

BACKGROUND OF THE DISCLOSURE

Microelectronic devices are continually reducing in size and cost. Moreover, densities of components in the microelectronic devices are increasing. As the size is reduced, power and current density is increased through the input/output (I/O) structures such as bump bond structures. This results in higher temperatures, and risks failures due to electromigration. Meeting reliability targets and cost targets together has been challenging for package designs.

SUMMARY OF THE DISCLOSURE

The present disclosure introduces a microelectronic device having a die with input/output (I/O) terminals, a dielectric layer on the die, and pillars electrically coupled to the I/O terminals, and extending through the dielectric layer to an exterior of the microelectronic device. The pillars are electrically conductive. Each pillar includes a column electrically coupled to one of the I/O terminals, and a head contacting the column at an opposite end of the column from the I/O terminal. The head extends laterally past the column in at least one lateral direction. Methods of forming the pillars and the dielectric layer are disclosed.

DETAILED DESCRIPTION OF EXAMPLE EMBODIMENTS

Figure 1:
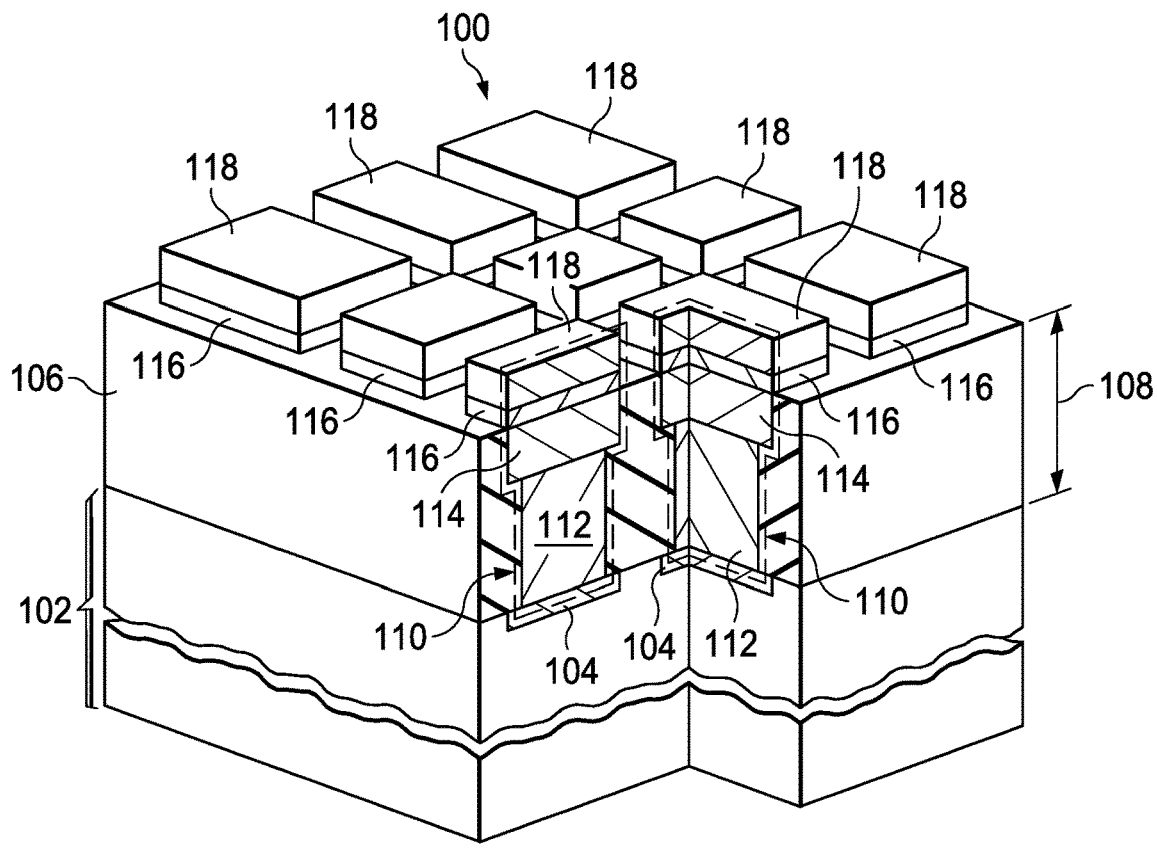
FIG. 1 is a cross section of an example microelectronic device.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device has a die with input/output (I/O) terminals. The die may be manifested, for example, as an integrated circuit, a discrete semiconductor device, or a microelectrical mechanical system (MEMS) device. The I/O terminals may include, for example, bond pads, bond areas of a redistribution layer (RDL), or bond areas of a top interconnect level. The microelectronic device includes a dielectric layer on the die. The dielectric layer may include, for example, organic polymer, silicone polymer, or inorganic dielectric material. The microelectronic device further includes pillars electrically coupled to the I/O terminals. The pillars may directly contact the I/O terminals, or may be electrically coupled to the I/O pads through electrically conductive material. The pillars extend through the dielectric layer to an exterior of the microelectronic device. The pillars are electrically conductive. Each pillar includes at least one column electrically coupled to at least one of the I/O terminals. Each pillar further includes a head contacting the at least one column. The head is located on an opposite end of the pillar from the I/O terminal. The head extends laterally past the column in at least one lateral direction. The dielectric layer extends from the die to the head, and laterally surrounds the column. For the purposes of this disclosure, the terms "lateral" and "laterally" are understood to refer to a direction parallel to a plane of a surface of the die on which the I/O terminals are located.

It is noted that terms such as top, over, and above may be used in this disclosure. These terms should not be construed as limiting the position or orientation of a structure or element, but should be used to provide spatial relationship between structures or elements.

For the purposes of this disclosure, it will be understood that, if an element is referred to as being connected to, coupled to, on, or in contact with, another element, it may be directly connected to, directly coupled to, directly on, or directly in contact with, the other element, or intervening elements may be present. If an element is referred to as being directly connected to, directly coupled to, directly on, or directly in contact with, another element, it is understood there are no other intentionally disposed intervening elements present. Other terms used to describe relationships between elements should be interpreted in like fashion, for example, between versus directly between, adjacent versus directly adjacent, and so on.

FIG. 1 is a cross section of an example microelectronic device. The microelectronic device 100 includes a die 102. The die 102 may contain at least one integrated circuit having a semiconductor substrate and an interconnect region. Alternatively, the die 102 may contain at least one discrete semiconductor device such as a power transistor. Further, the die 102 may contain a MEMS device such as an acceleration sensor. Other manifestations of the die 102 are within the scope of this example. The die 102 includes I/O terminals 104. The I/O terminals 104 may be bond pads electrically coupled to interconnects of the microelectronic device. Alternatively, the I/O terminals 104 may be bond areas of an RDL which is located over, and is electrically coupled to, the interconnects of the microelectronic device. Further, the I/O terminals 104 may be bump pads in a bond-over-active (BOAC) structure of the microelectronic device. Other manifestations of the I/O terminals 104 are within the scope of this example. The I/O terminals 104 may vary in size across the die 102, or may be uniform in size.

The microelectronic device 100 includes a dielectric layer 106 on the die 102. The dielectric layer 106 may include, for example, organic polymer such as epoxy, crosslinked polyisoprene, polyimide, or methacrylate. Alternatively, the dielectric layer 106 may include silicone polymer. Further, the dielectric layer 106 may include inorganic dielectric material such as silicon dioxide, silicon nitride, silicon oxynitride, or aluminum oxide. The dielectric layer 106 may have a thickness 108 of 5 microns to 100 microns, for example.

The microelectronic device 100 includes pillars 110 which are electrically coupled to the I/O terminals 104. The pillars 110 extend through the dielectric layer 106 to an exterior of the microelectronic device 100. Each pillar 110 includes a column 112 which is electrically coupled to one of the I/O terminals 104. The columns 112 may be directly contacting the I/O terminals 104, as depicted in FIG. 1. Alternatively, the columns 112 may be electrically coupled to the I/O terminals 104 through an electrically conductive material, such as a seed layer for an electroplating operation. The columns 112 are electrically conductive. The columns 112 may have, for example, a copper core laterally surrounded by a column liner which reduces diffusion of copper from the copper core into the dielectric layer 106. Alternatively, the columns 112 may include other metals such as nickel, platinum, aluminum, tungsten, or gold, or other electrically conductive material such as graphene or carbon nanotubes.

The pillars 110 further include heads 114 on the columns 112. Each of the columns 112 is contacted by at least one of the heads 114, and each of the heads 114 contacts at least one of the columns 112. The heads 114 may directly contact the columns 112, or may contact the columns 112 through an electrically conductive material such as a portion of a diffusion barrier or seed layer. The heads 114 may have compositions similar to compositions of the columns 112, or may have different compositions. The I/O terminals 104 are coupled to a first end of the columns 112, and the heads 114 contact a second end of the columns 112, the second end being located opposite from the first end. Each of the heads 114 extends laterally past the column 112 contacted by that head 114 in at least one lateral direction, and possibly in lateral directions. The columns 112 and the heads 114 may have any of the configurations and may include any of the materials disclosed in the commonly assigned patent application having patent application Ser. No. 16/030,371, filed Jul. 9, 2018, which is incorporated herein by reference but is not admitted to be prior art with respect to the present invention by its mention in this section.

The pillars 110 may include barrier layers 116 on the heads 114. The barrier layers 116 may include, by way of example, nickel, palladium, platinum, titanium, tantalum, cobalt, tungsten, molybdenum, or zinc. The barrier layers 116 may advantageously reduce oxidation or contamination of the heads 114.

The pillars 110 may further include solder layers 118 on the barrier layers 116, or on the heads 114 if the barrier layers 116 are omitted. The solder layers 118 are located at an exterior of the microelectronic device 100. The solder layers 118 may include, by way of example, tin, silver, bismuth, or other metals. The barrier layers 116 may advantageously reduce formation of intermetallic compounds.

The dielectric layer 106 extends from the die 102 to the heads 114, and may optionally extend further, to the barrier layers 116 or to the solder layers 118. The pillars 110 extend from the I/O terminals 104, through the dielectric layer 106, to an exterior of the microelectronic device 100. The dielectric layer 106 may advantageously provide support for the pillars 110 and provide protection for the die 102 during subsequent assembly and packaging operations.

Figure 2A:
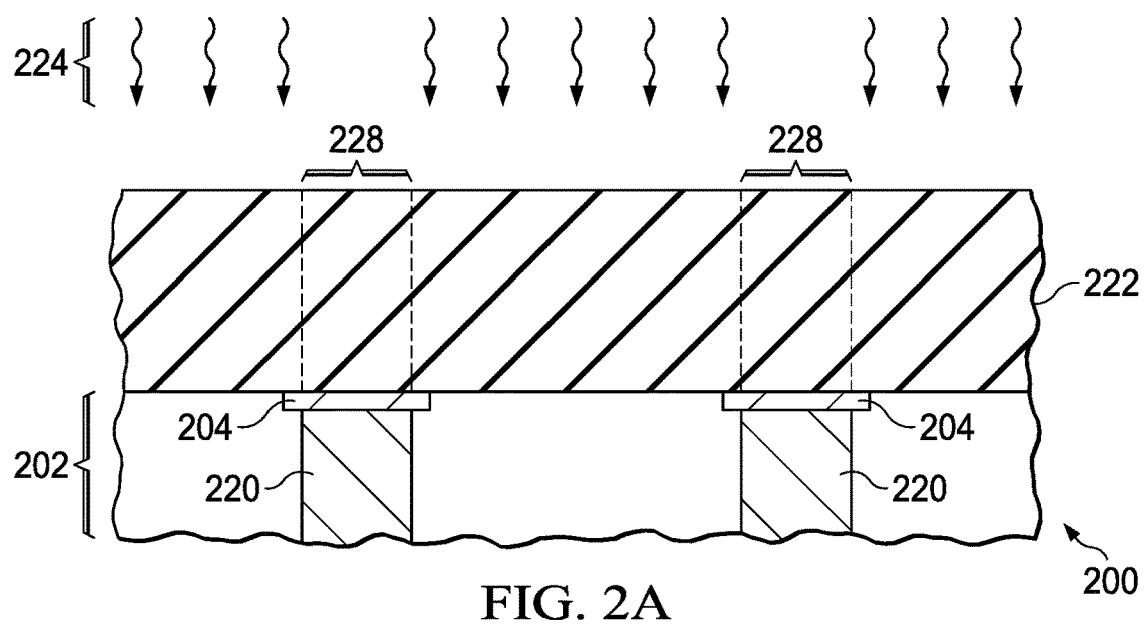
FIG. 2A through FIG. 2L are cross sections of a microelectronic device depicted in stages of an example method of formation.

FIG. 2A through FIG. 2L are cross sections of a microelectronic device depicted in stages of an example method of formation. Referring to FIG. 2A, the microelectronic device 200 includes a die 202. The die 202 may be a portion of a semiconductor wafer or MEMS substrate. The semiconductor wafer or the MEMS substrate may contain additional die, not shown in FIG. 2A, similar to the die 202. Alternatively, the die 202 may be separate from other die, for example as a result of singulating the die 202 from a semiconductor wafer or MEMS substrate.

The die 202 includes I/O terminals 204. The I/O terminals 204 may include primarily aluminum or copper, and may have cap layers or under bump metallization (UBM) layers of nickel, palladium, platinum, gold, or other metals. The I/O terminals 204 may be electrically coupled to components in the die 202 through vias 220 or other electrically conductive structures in the die 202.

A trench material layer 222 is formed on the die 202, covering the I/O terminals 204. The trench material layer 222 may include photosensitive polymer material, for example, photoresist containing polyisoprene, photosensitive polyimide, photosensitive epoxy such as SU-8, or photoresist containing methacrylate. The trench material layer 222 may include organic resin such as poly methyl methacrylate (PMMA) which is sensitive to electron beam radiation. The trench material layer 222 may be formed, for example, by a spin-coat process, or by application as a dry film.

The trench material layer 222 is exposed to patterned radiation 224 such as ultraviolet (UV) radiation from a photolithographic tool. The patterned radiation 224 has a spatial distribution aligned to a spatial distribution of the I/O terminals 204. In one version of this example, in which the photosensitive polymer material in the trench material layer 222 has a negative tone, the patterned radiation 224 may expose the trench material layer 222 in areas for a subsequently-formed column trench sublayer 226, shown in FIG. 2B. Referring back to FIG. 2A, the patterned radiation 224 may be blocked from areas for column trenches 228 over the I/O terminals 204, as depicted in FIG. 2A. In an alternate version of this example, in which the photosensitive polymer material in the trench material layer 222 has a positive tone, the patterned radiation 224 may expose the trench material layer 222 in the areas for the column trenches 228, and may be blocked from areas for the subsequently-formed column trench sublayer 226.

Figure 2B:
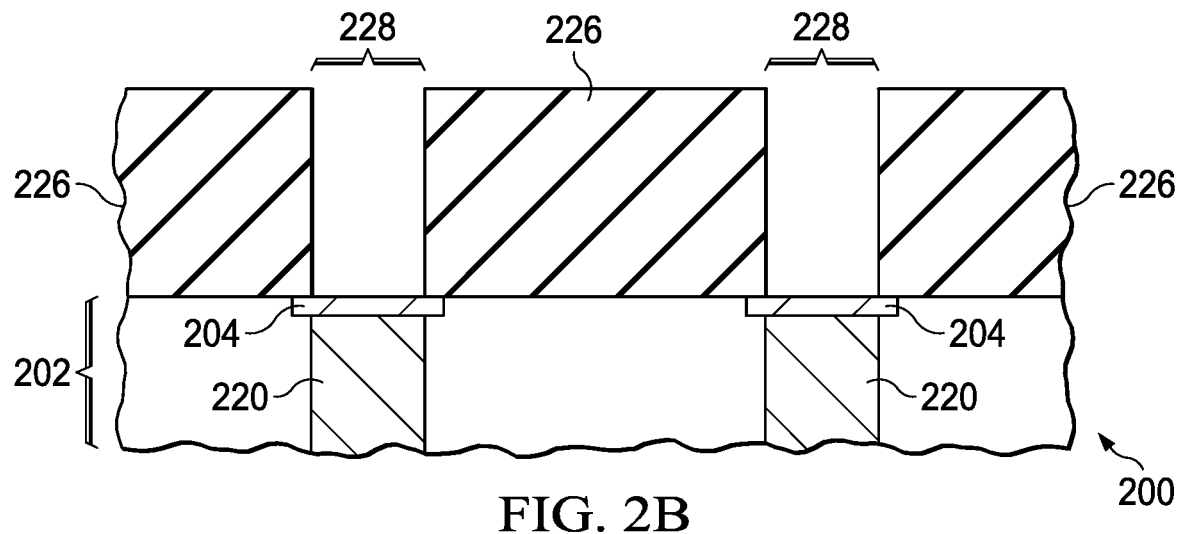

Referring to FIG. 2B, a develop operation removes material from the trench material layer 222 of FIG. 2A in the column trenches 228, to form the column trench sublayer 226. The column trench sublayer 226 may be heated to remove volatile material such as solvent, and optionally to increase cross-linking between polymer molecules in the column trench sublayer 226 to provide more durability. The column trenches 228 in the column trench sublayer 226 expose the I/O terminals 204.

Alternatively, the column trench sublayer 226 may be formed by removing material from the trench material layer 222 of FIG. 2A by a laser ablation process. Using the laser ablation process enables forming the column trench sublayer 226 from a wider range of materials, including materials that are not photosensitive, which may advantageously reduce fabrication costs of the microelectronic device 200.

Figure 2C:
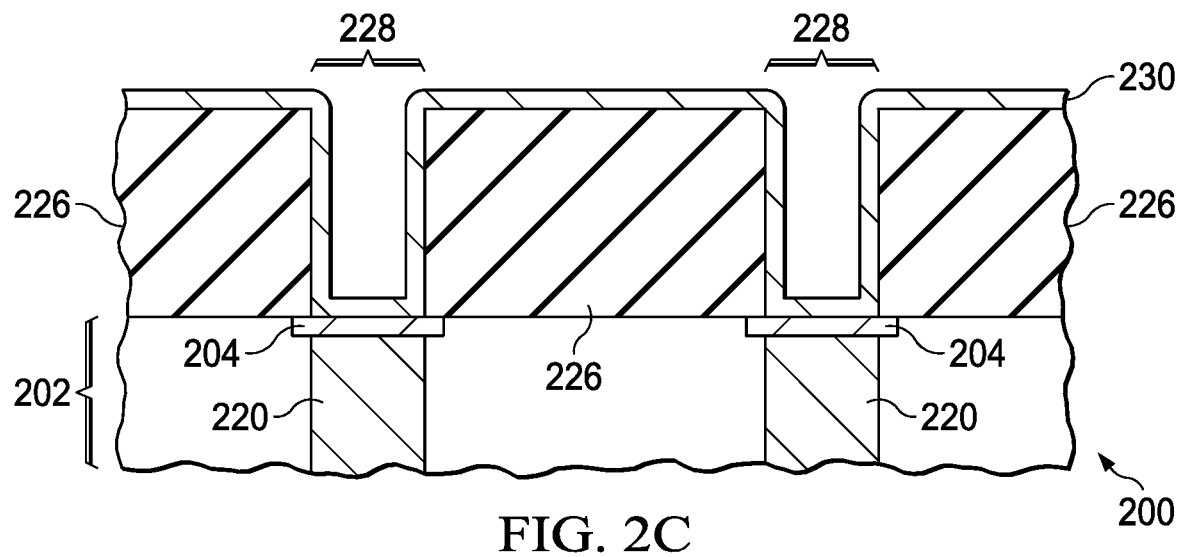

Referring to FIG. 2C, a column liner 230 is formed on the column trench sublayer 226, extending into the column trenches 228 and contacting the I/O terminals 204. The column liner 230 may include an adhesion sublayer which directly contacts the column trench sublayer 226 in the column trenches 228. The adhesion sublayer may include metals which have good adhesion to the column trench sublayer 226, such as titanium or titanium tungsten, and may be formed by a sputter process. The column liner 230 may also include a barrier sublayer which is effective at reducing diffusion of copper into the column trench sublayer 226. The barrier sublayer may include, for example, titanium nitride or tantalum nitride, and may be formed by a reactive sputter process or by an atomic layer deposition (ALD) process. The column liner 230 may include a seed sublayer which provides a suitable electrically conductive surface for a subsequent electroplating operation. The seed sublayer may include nickel or copper, for example, and may be formed by a sputter process or an evaporation process.

Figure 2D:
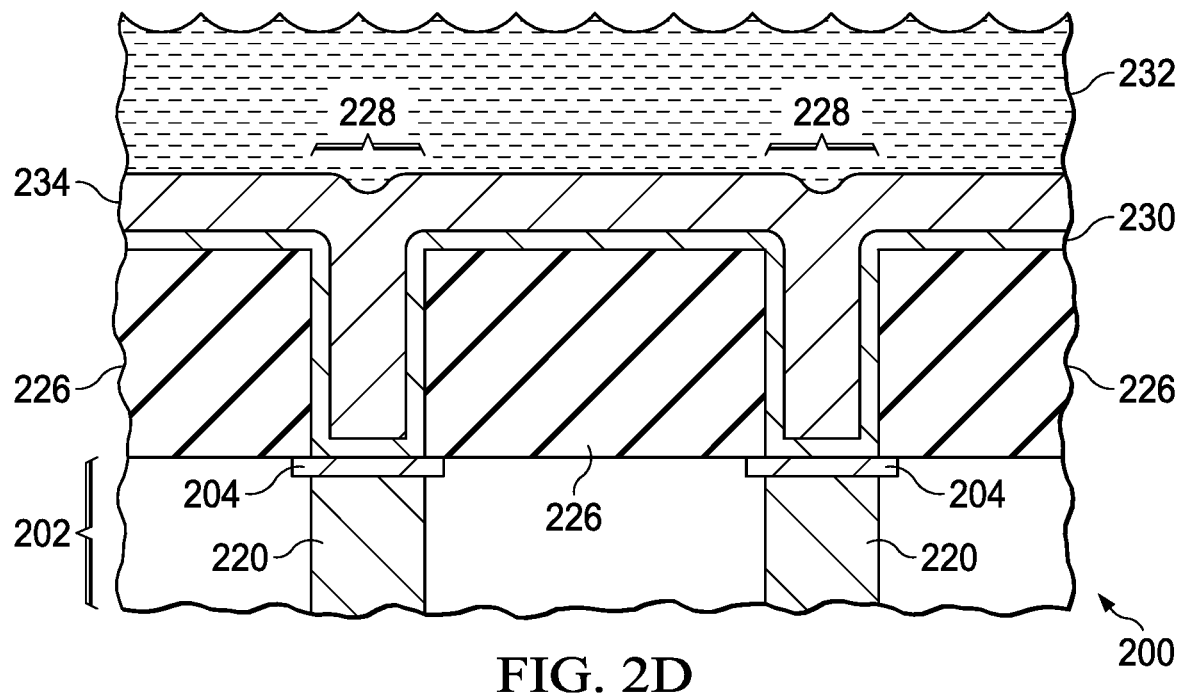

Referring to FIG. 2D, a column electroplating process using a column plating bath (232) forms a column layer 234 on the column liner 230. The column layer 234 fills the column trenches 228 and extends over the column trench sublayer 226 adjacent to the column trenches 228. The column layer 234 may include primarily copper, for example, greater than 90 weight percent copper. The column layer 234 may also include other metals, such as nickel, silver, or gold. The column plating bath (232) includes copper, for example in the form of copper sulfate. The column plating bath (232) may include additives such as levelers; suppressors, sometimes referred to as inhibitors; and accelerators, sometimes referred to as brighteners, to provide a desired low thickness of the column layer 234 over the column trench sublayer 226 adjacent to the column trenches 228.

Figure 2E:
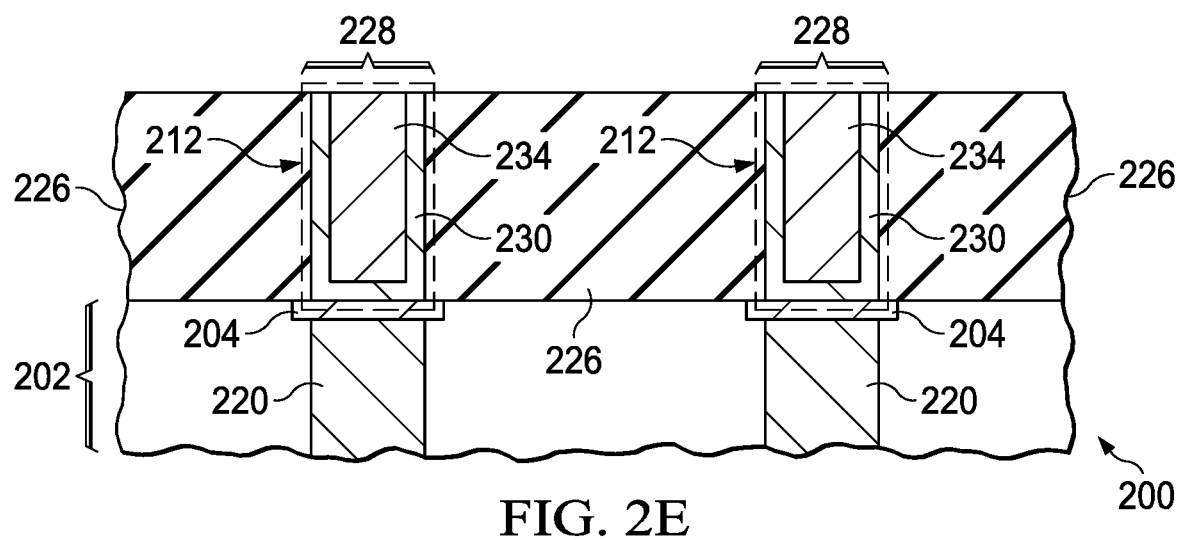

Referring to FIG. 2E, the column layer 234 and the column liner 230, over the column trench sublayer 226 adjacent to the column trenches 228, are removed, leaving the column liner 230 and the column layer 234 in the column trenches 228 to provide columns 212. The column liner 230 extends around a lateral boundary of each column 212. The column layer 234 over the column trench sublayer 226 may be removed, for example, by a copper chemical mechanical polishing (CMP) process, which uses a polishing pad and a slurry which removes copper. The column liner 230 over the column trench sublayer 226 may also be removed by the copper CMP process, or may be removed by a selective wet etch process. The method to form the columns 212 as disclosed in reference to FIG. 2C through FIG. 2E is sometimes referred to as a damascene process, specifically a copper damascene process.

Figure 2F:
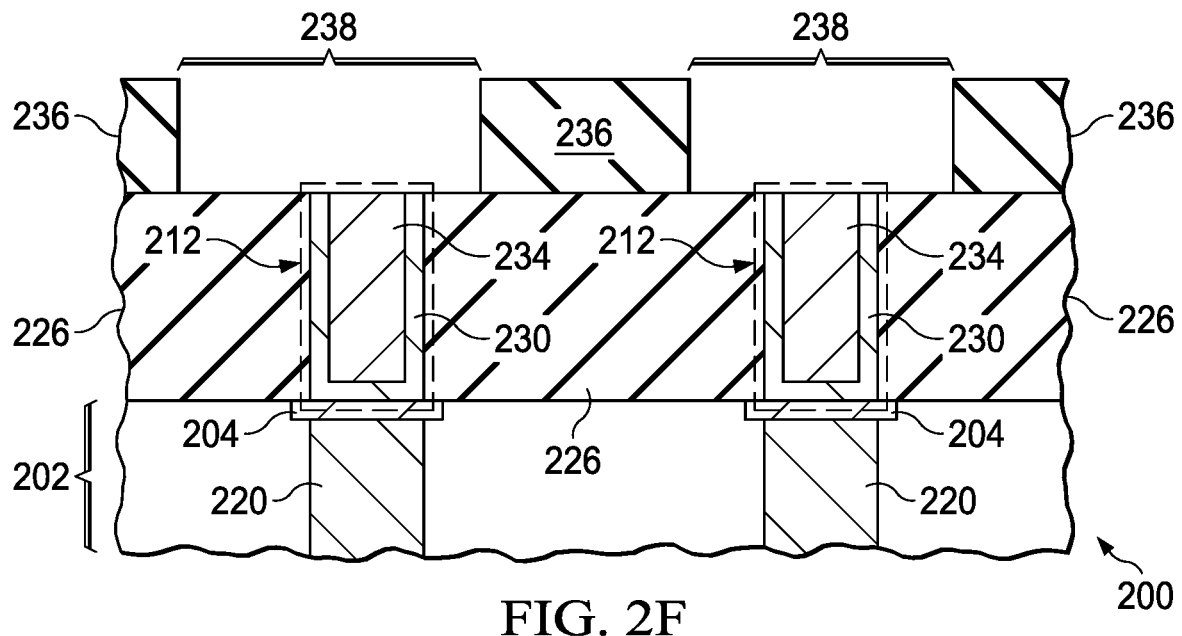

Referring to FIG. 2F, a head trench sublayer 236 is formed over the column trench sublayer 226. The head trench sublayer 236 has head trenches 238 which expose tops of the columns 212. Each of the head trenches 238 extends laterally past the top of the column 212 which is exposed by that head trench 238, in at least one lateral direction. The head trench sublayer 236 may have a composition similar to a composition of the column trench sublayer 226. Furthermore, the head trench sublayer 236 may be formed by a process sequence similar to the steps disclosed in reference to FIG. 2A and FIG. 2B used to form the column trench sublayer 226.

Figure 2G:
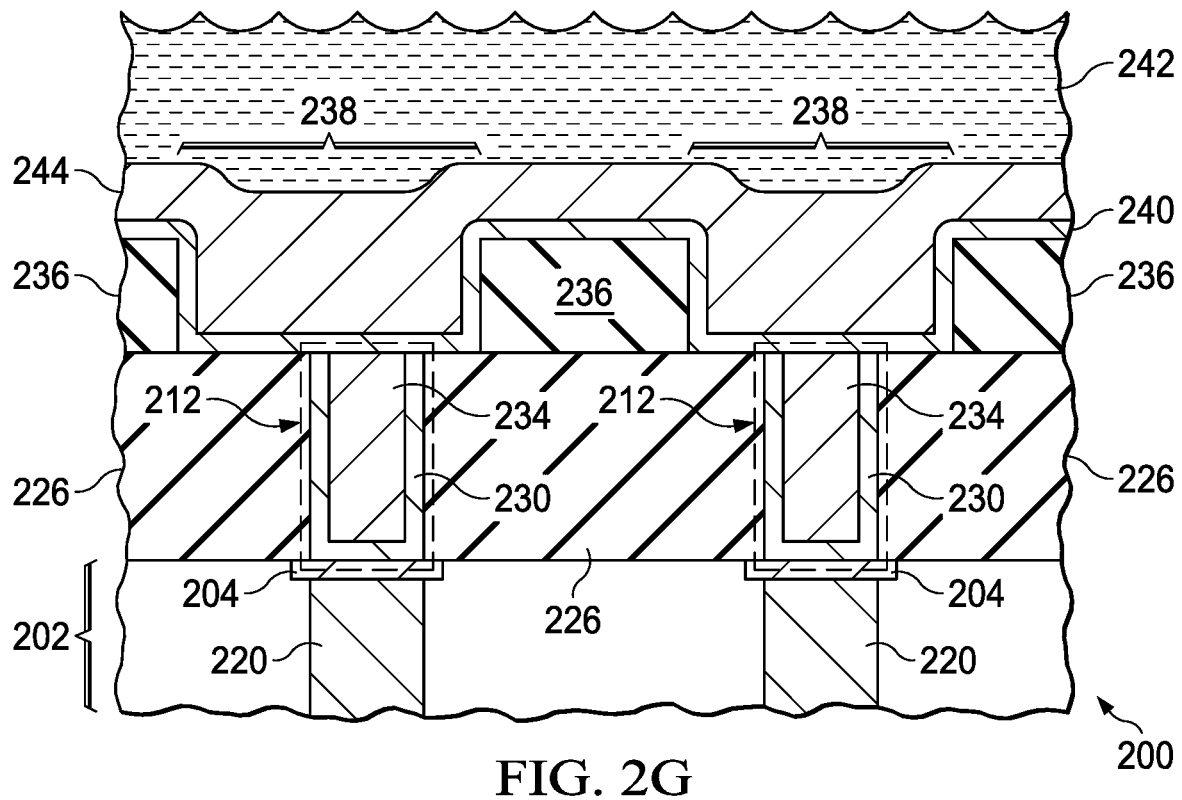

Referring to FIG. 2G, a head liner 240 is formed on the head trench sublayer 236, extending into the head trenches 238, and contacting the columns 212. The head liner 240 may have a sublayer structure and composition similar to a sublayer structure and composition of the column liner 230, that is, an adhesion sublayer including titanium or titanium tungsten, a barrier sublayer including titanium nitride or tantalum nitride, and a seed sublayer including nickel or copper. The sublayers of the head liner 240 may be formed by processes similar to the processes used to form the sublayers of the column liner 230, that is, a sputter process, a reactive sputter process or an ALD process, and a sputter process or an evaporation process.

A head electroplating process using a head plating bath (242) forms a head layer 244 on the head liner 240. The head layer 244 fills the head trenches 238 and extends over the head trench sublayer 236 adjacent to the head trenches 238. The head layer 244 may include primarily copper, and may have a composition similar to the column layer 234. The head plating bath (242) includes copper, and may include similar additives to the column plating bath 232 of FIG. 2D, that is, levelers; suppressors, and accelerators, to provide a desired low thickness of the head layer 244 over the head trench sublayer 236 adjacent to the head trenches 238.

Figure 2H:
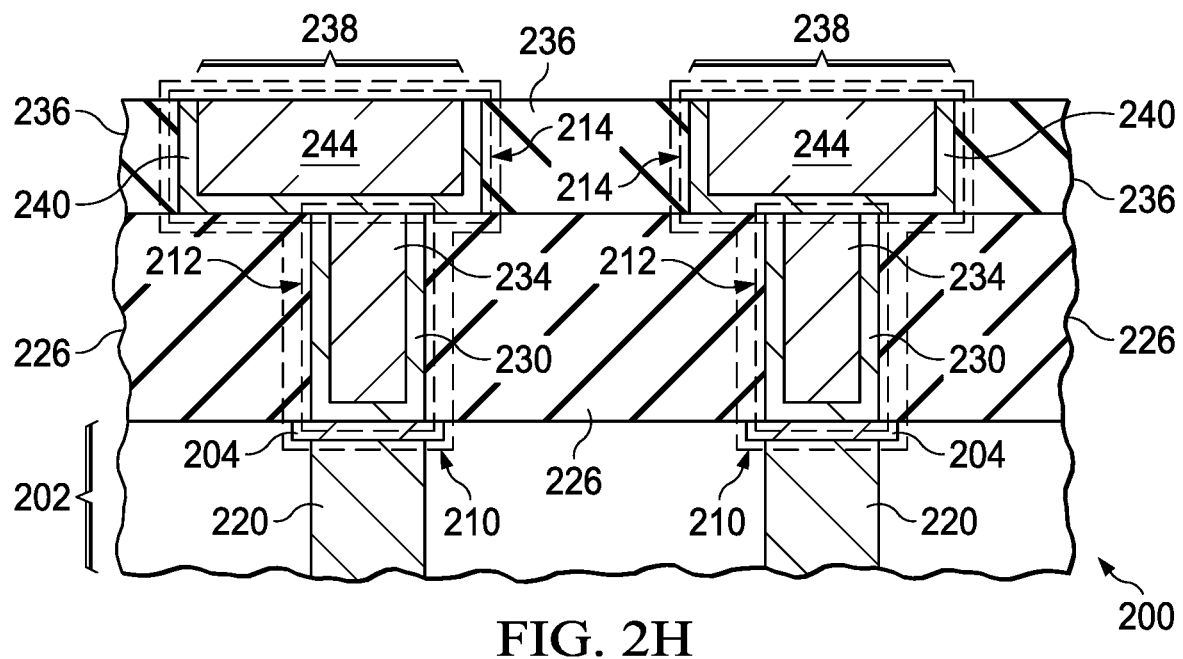

Referring to FIG. 2H, the head layer 244 and the head liner 240, over the head trench sublayer 236 adjacent to the head trenches 238, are removed, leaving the head liner 240 and the head layer 244 in the head trenches 238 to provide heads 214. The head liner 240 extends around a lateral boundary of each head 214. The head layer 244 and the head liner 240 may be removed from over the head trench sublayer 236 by a copper CMP process, optionally followed by a wet etch process. The heads 214 make electrical connections to the columns 212. The columns 212 combined with the heads 214 provide pillars 210 of the microelectronic device 200. The column liner 230 may advantageously reduce diffusion of copper from the column layer 234 into the column trench sublayer 226. Similarly, the head liner 240 may advantageously reduce diffusion of copper from the head layer 244 into the head trench sublayer 236. Diffusion of copper into the column trench sublayer 226 or into the head trench sublayer 236 may degrade reliability of the microelectronic device 200.

Figure 2I:
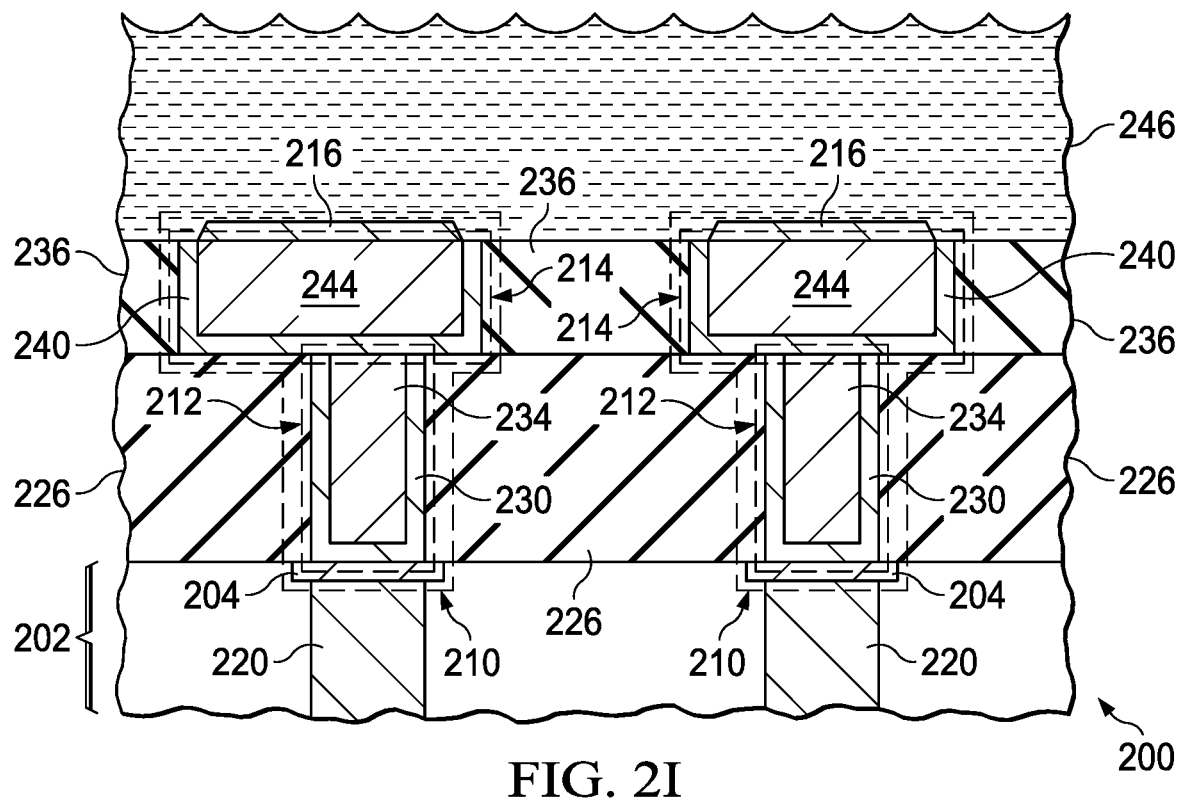

Referring to FIG. 2I, a barrier plating process using a barrier plating bath 246 forms barrier layers 216 on the heads 214. The barrier layers 216 are parts of the pillars 210. The barrier plating process may be an electroless plating process. The barrier layers 216 may have compositions as disclosed in reference to the barrier layers 116 of FIG. 1. The barrier plating bath 246 may include nickel, in the form of nickel sulfate, and may include other metals, in the form of metal salts, to form a desired composition for the barrier layers 216. The barrier layers 216 are components of the pillars 210. Other methods of forming the barrier layers 216 are within the scope of the instant example.

Figure 2J:
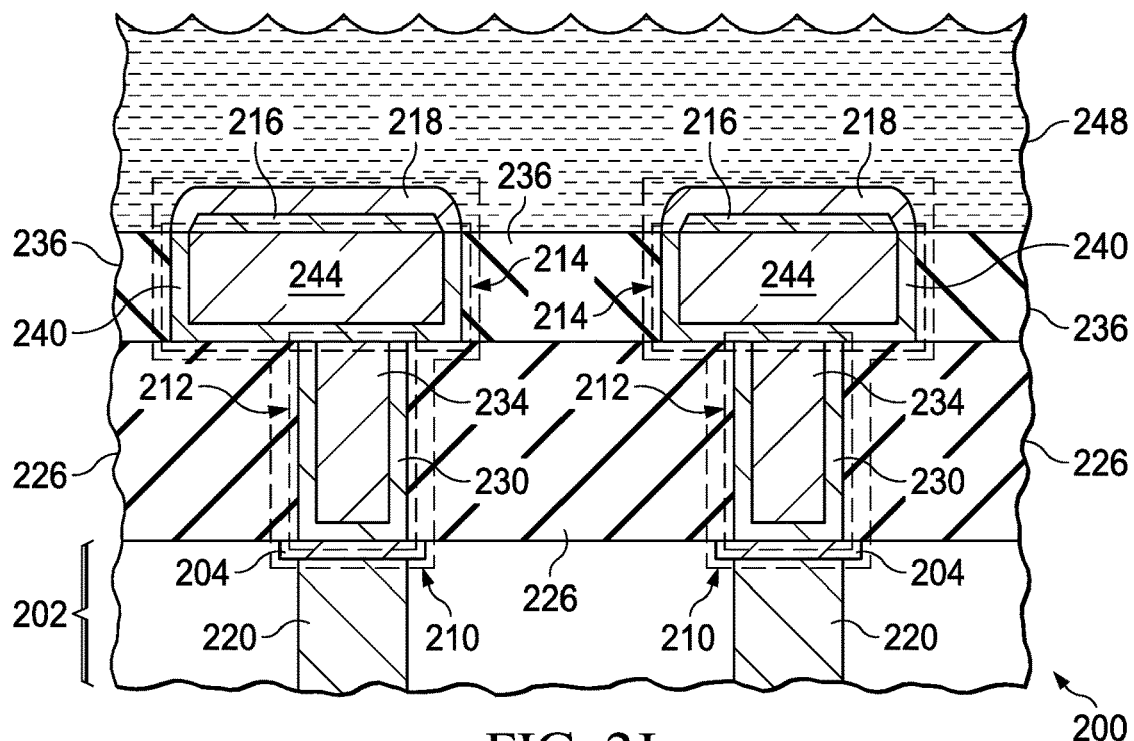

Referring to FIG. 2J, the barrier layers 216 are exposed to a liquid solder source 248 containing melted solder which forms solder layers 218 on the barrier layers 216. The solder layers 218 are parts of the pillars 210. The liquid solder source 248 may be pumped onto the microelectronic device 200 to expose the barrier layers 216 to the melted solder. Alternatively, the microelectronic device 200 may be dipped into the melted solder of the liquid solder source 248 to expose the barrier layers 216 to the melted solder. The solder layers 218 may have a composition as disclosed in reference to the solder layers 118 of FIG. 1, that is, may include tin, silver, bismuth, or other metals. The solder layers 218 are components of the pillars 210.

Figure 2K:
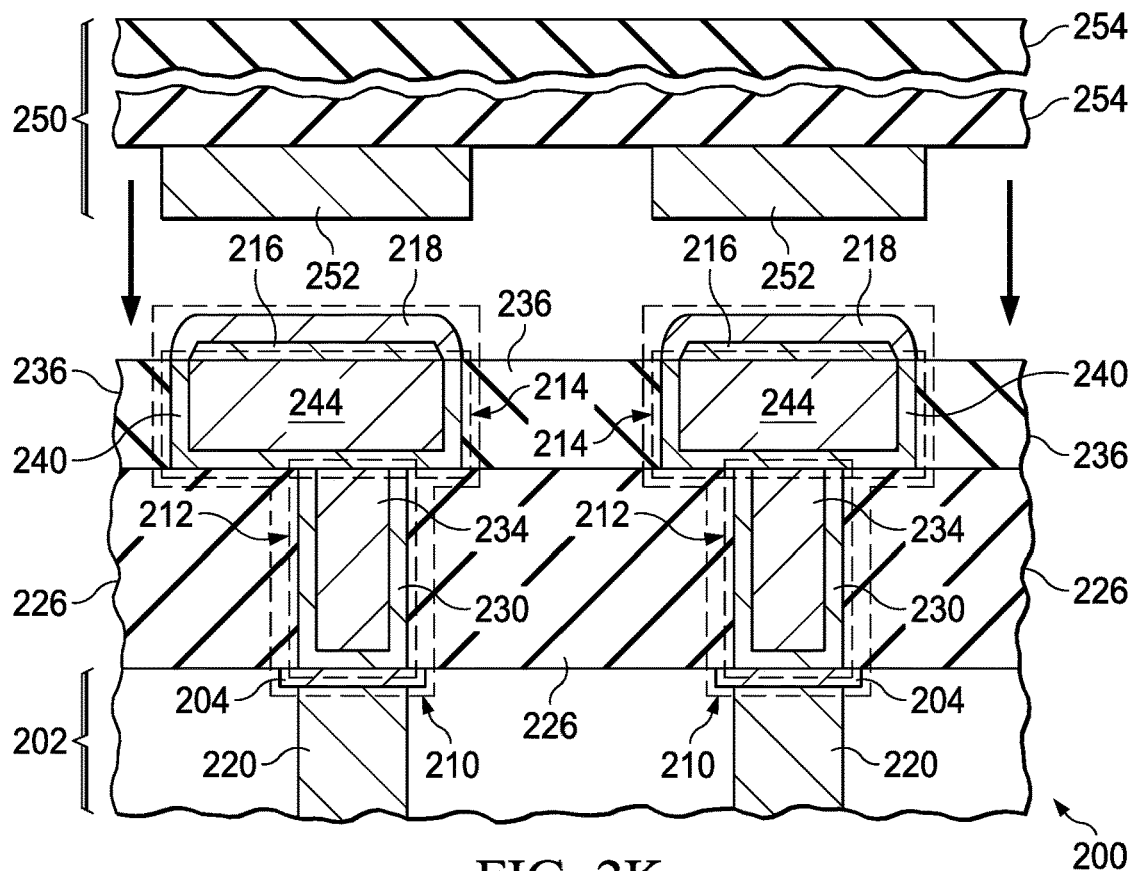

Referring to FIG. 2K, the microelectronic device 200 is assembled onto a circuit substrate 250. The circuit substrate 250 may be manifested as a printed circuit board (PCB) or a ceramic wiring substrate, for example. The circuit substrate 250 has pads 252 which are electrically conductive, located on an insulating layer 254. The pads 252 may be manifested as die pads, leads, traces, routings, or other electrically conductive component of the circuit substrate 250. The pads 252 may include primarily copper, and may optionally include gold, nickel, or other metal to provide a suitable surface for a solder joint. The insulating layer 254 may be manifested as a fiberglass reinforced plastic (FRP) board, a ceramic substrate, or other insulating medium. The microelectronic device 200 is assembled onto the circuit substrate 250 by bringing the solder layers 218 into contact with the pads 252 and heating the solder layers 218 to form solder connections between the pillars 210 and the pads 252.

Figure 2L:
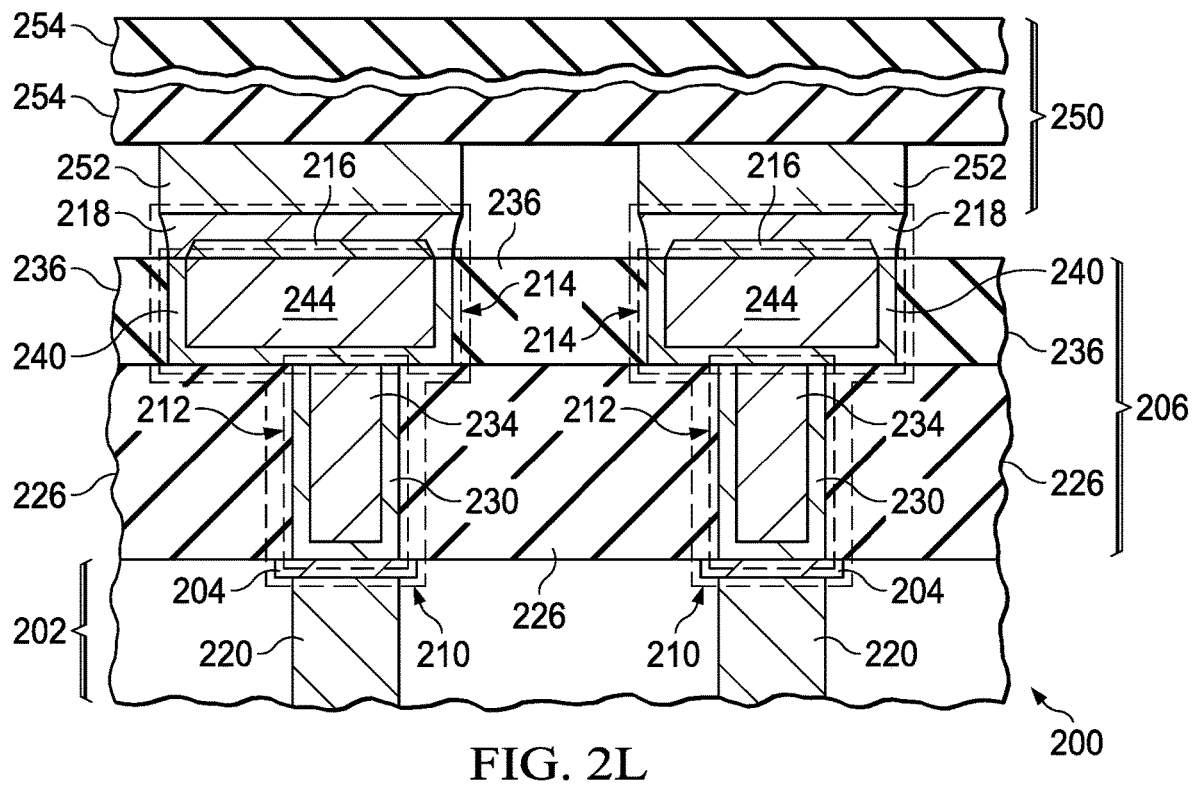

FIG. 2L depicts the microelectronic device 200 assembled onto the circuit substrate 250. The solder layers 218 provide solder connections between the pillars 210 and the pads 252. A combination of the column trench sublayer 226 and the head trench sublayer 236 provide a dielectric layer 206. The column trench sublayer 226 laterally surrounds the columns 212. The head trench sublayer 236 laterally surrounds the heads 214. The dielectric layer 206 of the instant example extends from the die 202 to the barrier layers 216, laterally surrounding the columns 212 and the heads 214. The dielectric layer 206 advantageously provides support for the pillars 210 and provides protection for the die 202 during assembly to the circuit substrate 250, and afterward, during use of the assembled microelectronic device 200.

Figure 3A:
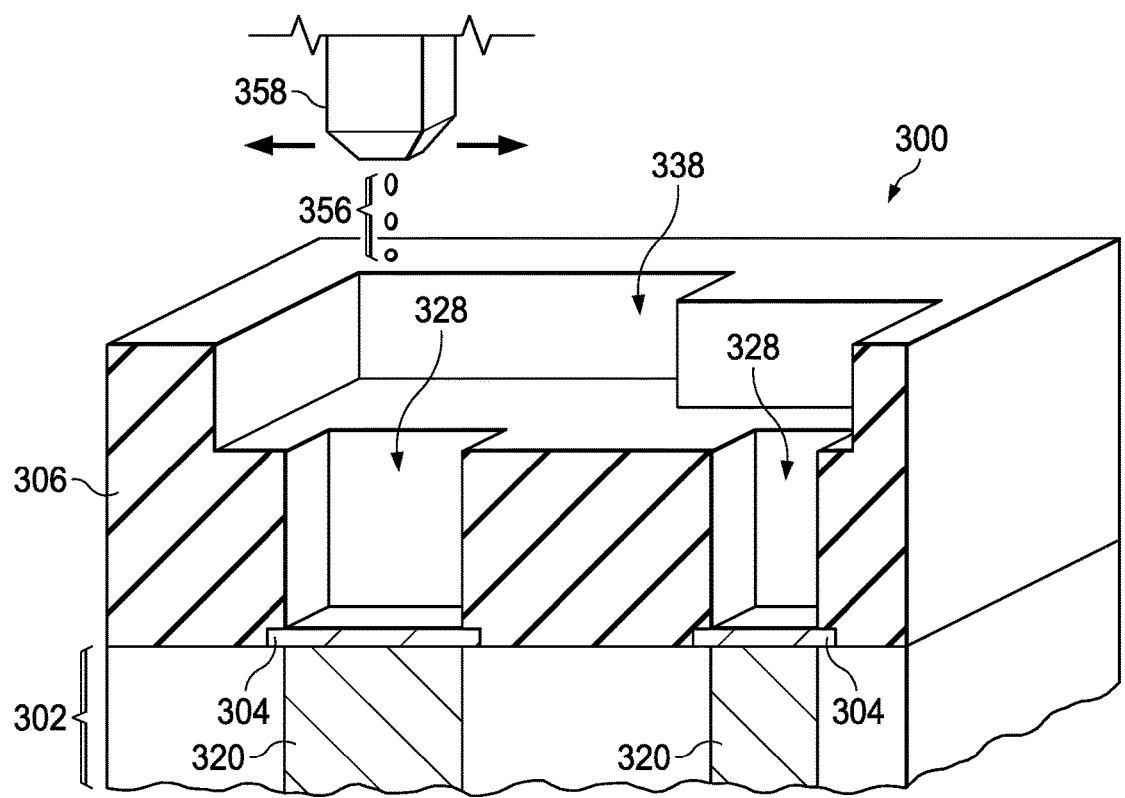
FIG. 3A through FIG. 3F are cross sections of a microelectronic device depicted in stages of another example method of formation.

FIG. 3A through FIG. 3F are cross sections of a microelectronic device depicted in stages of another example method of formation. Referring to FIG. 3A, the microelectronic device 300 includes a die 302. The die 302 may be a portion of a semiconductor wafer or MEMS substrate, or may be a discrete workpiece. The die 302 includes I/O terminals 304. The I/O terminals 304 may have compositions similar to the compositions disclosed in reference to the I/O terminals 204 of FIG. 2A. The die 302 may include electrically conductive members 320 which electrically couple the I/O terminals 304 to one or more components in the die 302.

A dielectric layer 306 is formed on the die 302. The dielectric layer 306 is formed to have column trenches 328 which expose the I/O terminals 304. The dielectric layer is further formed to have one or more head trenches 338 which open onto the column trenches 328. In the instant example, the head trench 338 opens onto two column trenches 328.

The dielectric layer 306 may be formed by a first additive process, as depicted in FIG. 3A, which disposes dielectric material 356 using a binder jetting apparatus 358 onto the die 302 to form at least a portion of the dielectric layer 306. For the purposes of this disclosure, an additive process may be understood to dispose the dielectric material 356 in a desired area and not dispose the dielectric material 356 outside of the desired area, so that it is not necessary to remove a portion of the disposed dielectric material 356 to produce a final desired shape of the dielectric layer 306. Additive processes may enable forming the dielectric layer 306 without photolithographic processes, thus advantageously reducing fabrication cost and complexity. Examples of additive processes suitable for forming the dielectric layer 306 include binder jetting, material jetting, directed energy deposition, material extrusion, powder bed fusion, sheet lamination, vat photopolymerization, direct laser deposition, electrostatic deposition, laser sintering, and photo-polymerization extrusion.

In one version of the instant example, the dielectric layer 306 may include organic polymer such as epoxy, benzocyclobutene (BCB), polyimide, or acrylic. In another version, the dielectric layer 306 may include silicone polymer. In a further version, the dielectric layer 306 may include inorganic dielectric material such as silicon dioxide, silicon nitride, boron nitride, or aluminum oxide. The inorganic dielectric material may be implemented as particles of the inorganic material, sintered or with a polymer binder.

The dielectric layer 306 may be heated after disposing the dielectric material 356, to remove volatile material from the dielectric layer 306, or to crosslink polymer material in the dielectric layer 306. The dielectric layer 306 may be heated, for example, by a radiant heating process, by a hotplate heating process, by a furnace heating process, or by a forced air convection heating process.

Figure 3B:
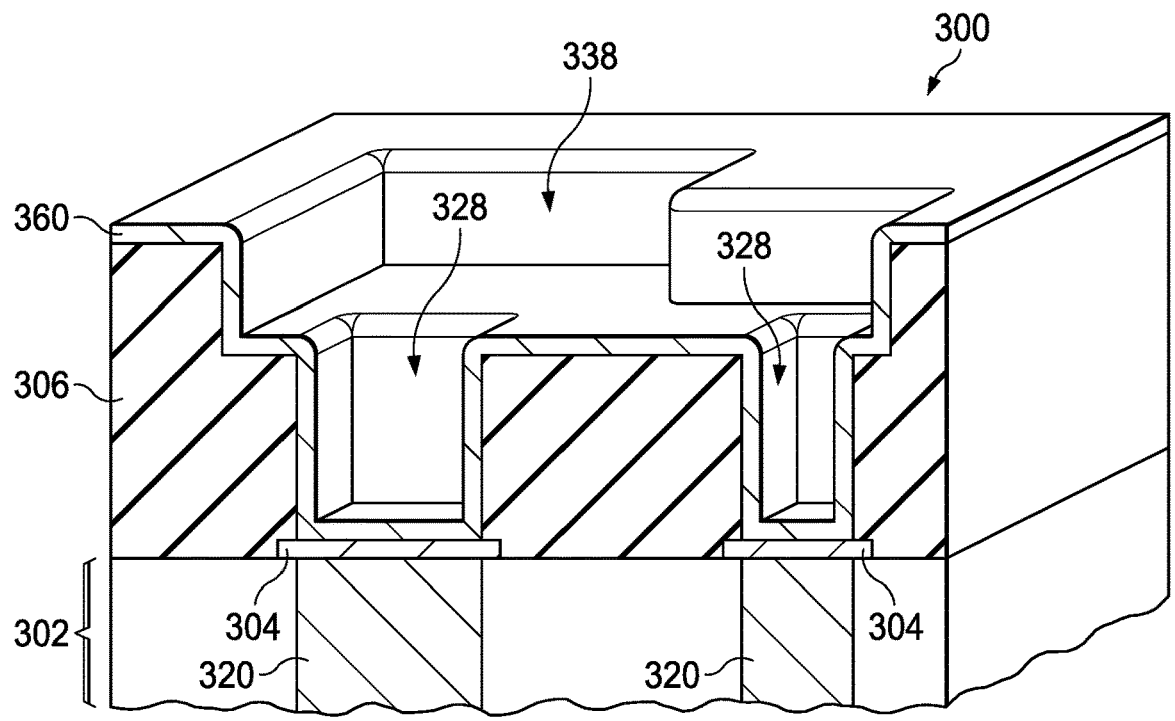

Referring to FIG. 3B, a pillar liner 360 is formed on the dielectric layer 306, extending into the head trench 338 and into the column trenches 328, and contacting the I/O terminals 304. The pillar liner 360 may have a layer structure and composition similar to the layer structure and composition disclosed in reference to the column liner 230 of FIG. 2C, that is, an adhesion sublayer including titanium or titanium tungsten, a barrier sublayer including titanium nitride or tantalum nitride, and a seed sublayer including nickel or copper. The pillar liner 360 may be formed by any of the processes disclosed in reference to the column liner 230, that is, a sputter process, a reactive sputter process or an ALD process, and a sputter process or an evaporation process.

Figure 3C:
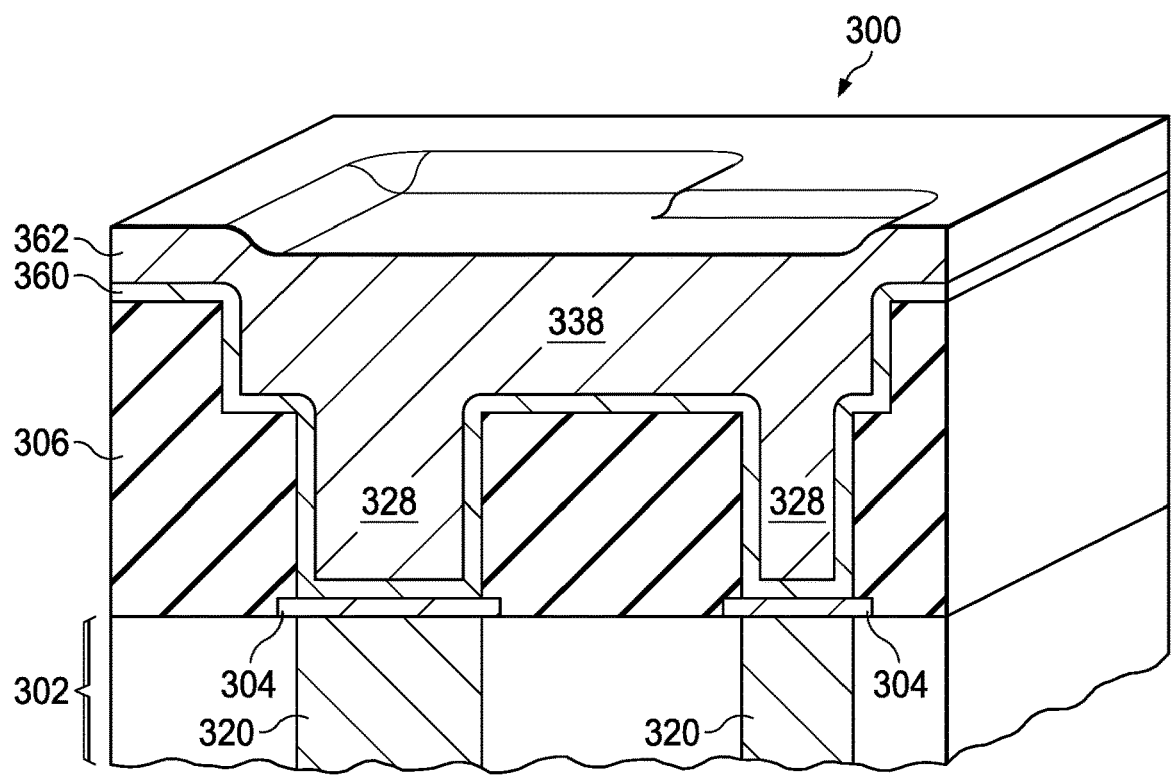

Referring to FIG. 3C, a pillar layer 362 is formed on the pillar liner 360, filling the column trenches 328 and the head trench 338, and extending onto the pillar liner 360 adjacent to the head trench 338. The pillar layer 362 may be formed by an electroplating process. The pillar layer 362 may include primarily copper, that is, greater than 90 weight percent copper. The pillar layer 362 may optionally include other metals, such as nickel, silver, or gold.

Figure 3D:
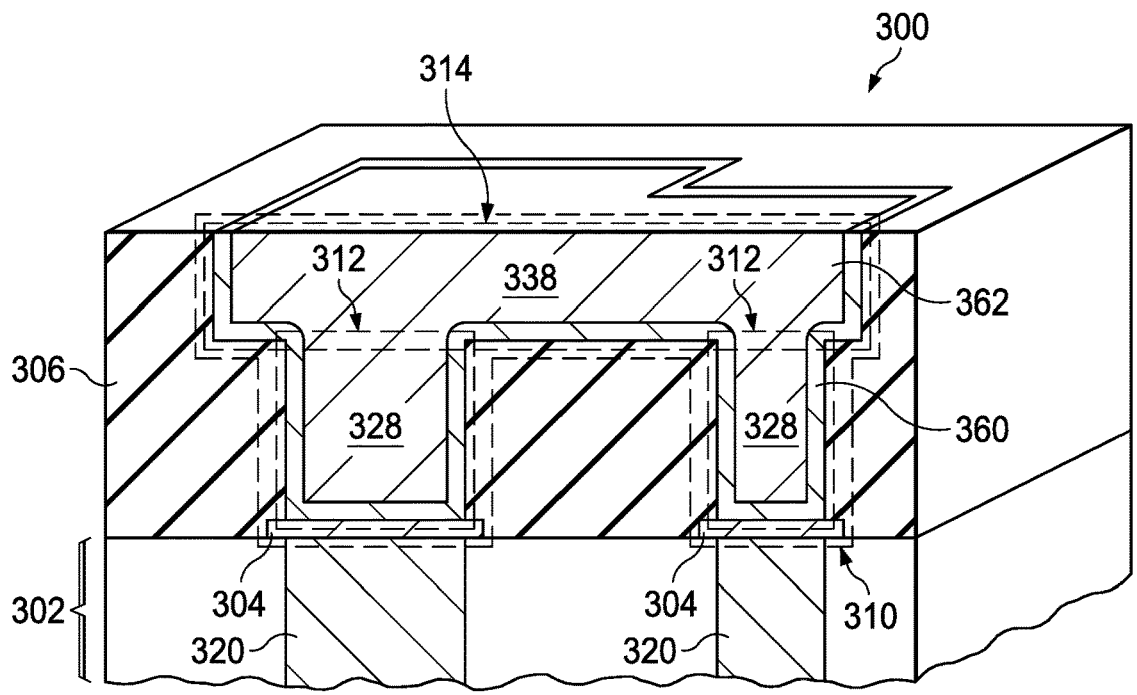

Referring to FIG. 3D, the pillar layer 362 and the pillar liner 360, over the dielectric layer 306 adjacent to the head trench 338, are removed, leaving the pillar layer 362 and the pillar liner 360 in the column trenches 328 and the head trench 338 to provide columns 312 and a head 314, respectively, of a pillar 310. The pillar layer 362 and the pillar liner 360 may be removed from over the dielectric layer 306 adjacent to the head trench 338, for example, by a CMP process, an etch back process, or a combination thereof. The method to form the columns 312 and the head 314 as disclosed in reference to FIG. 3B through FIG. 3D is sometimes referred to as a dual damascene process. The dual damascene process may provide reduced fabrication cost and complexity compared to other methods of forming the pillar 310.

Figure 3E:
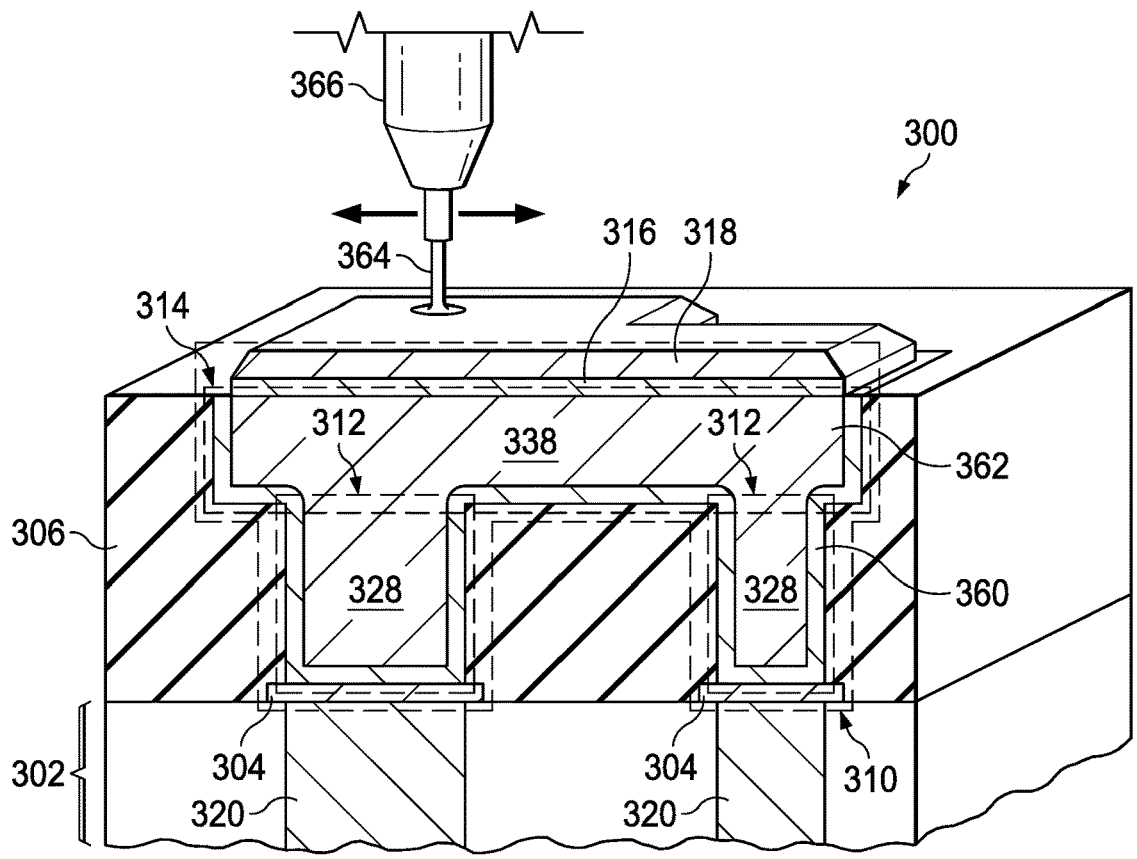

Referring to FIG. 3E, a barrier layer 316 is formed on the head 314. Additional barrier layers 316 are formed on additional heads 314, if present in the microelectronic device 300. The barrier layer 316 may have a composition as disclosed in reference to the barrier layers 116 of FIG. 1, that is, may include nickel, palladium, platinum, titanium, tantalum, cobalt, tungsten, molybdenum, or zinc, and may be formed as disclosed in reference to the barrier layers 216 of FIG. 2I. The barrier layer 316 is a component of the pillar 310, that is, by an electroless plating process, using a barrier plating bath.

A solder layer 318 is formed on the barrier layer 316. The solder layer 318 may be formed by a second additive process, for example a material extrusion process which disposes solder paste 364 onto the barrier layer 316 using a material extrusion apparatus 366. The solder layer 318 may be heated to remove volatile material or to reduce a resistance between the solder layer 318 and the barrier layer 316. The solder layer 318 is a component of the pillar 310. Additional solder layers 318 are formed on additional barrier layers 316, if present in the microelectronic device 300.

Figure 3F:
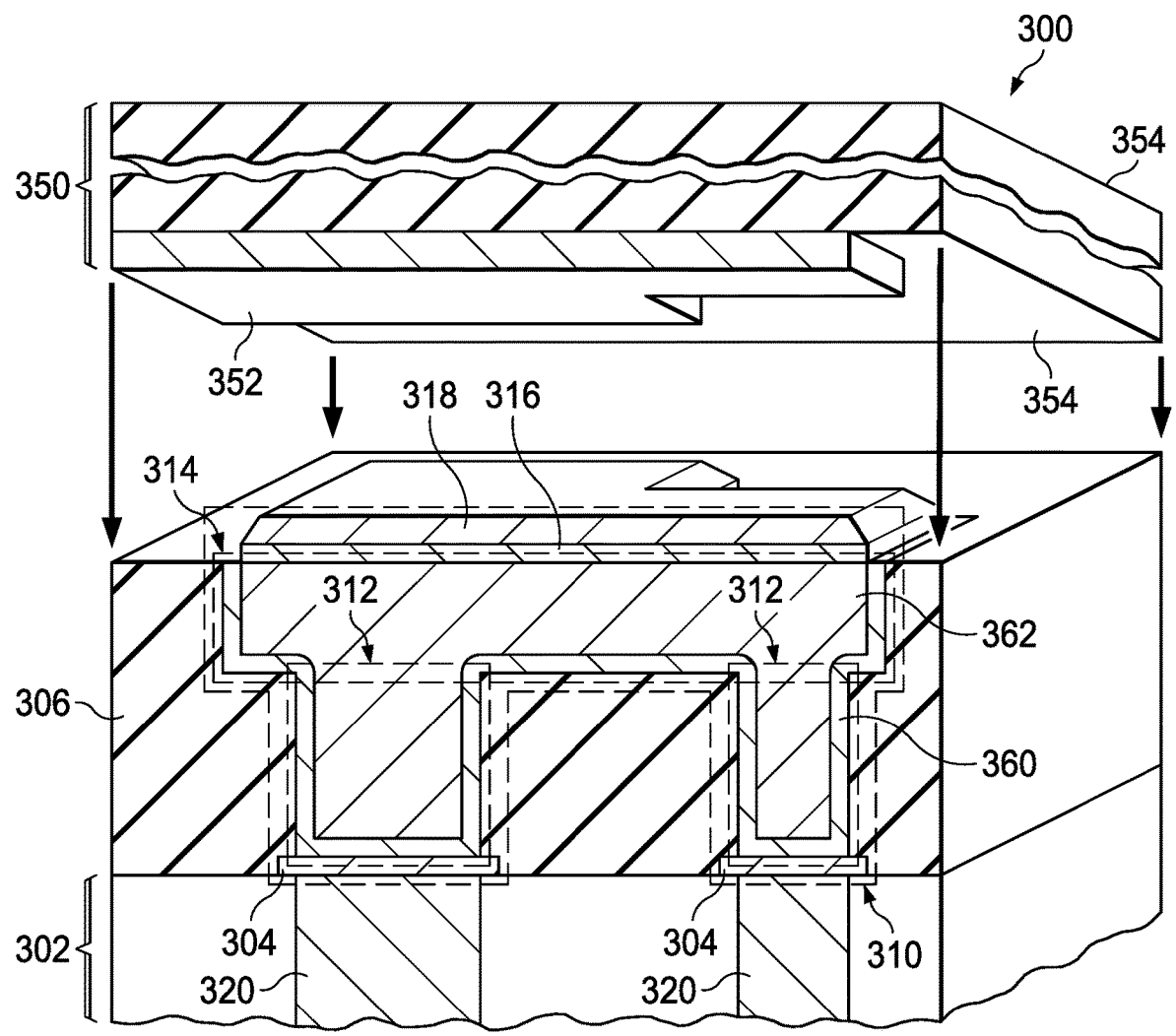

Referring to FIG. 3F, the microelectronic device 300 is assembled onto a circuit substrate 350. The circuit substrate 350 has a pad 352, which is electrically conductive, located on an insulating layer 354. The microelectronic device 300 is assembled onto the circuit substrate 350 by bringing the solder layer 318 into contact with the pad 352 and heating the solder layer 318 to form a solder connection between the pillar 310 and the pad 352. The dielectric layer 306 may accrue advantages for the microelectronic device 300 similar to those disclosed in reference to FIG. 2L, that is, may provide support for the pillar 310 and provides protection for the die 302 during assembly to the circuit substrate 350, and afterward, during use of the assembled microelectronic device 300.

Figure 4A:
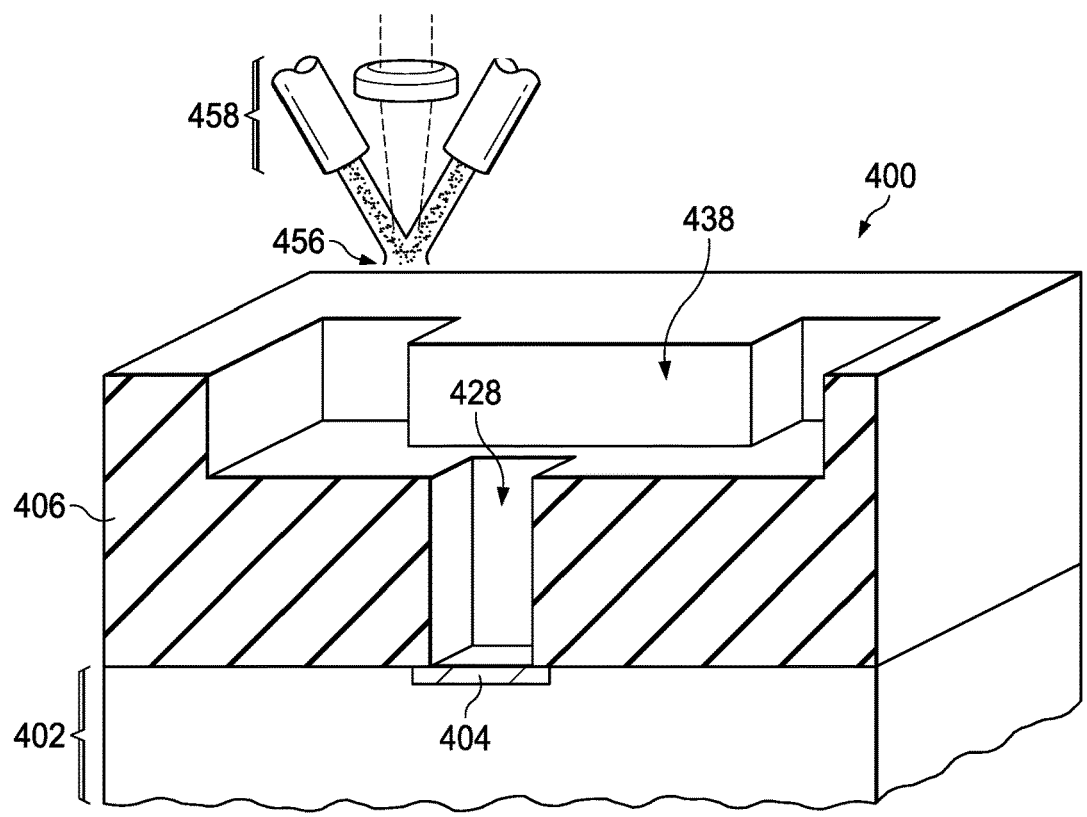
FIG. 4A through FIG. 4F are cross sections of a microelectronic device depicted in stages of another example method of formation.

FIG. 4A through FIG. 4F are cross sections of a microelectronic device depicted in stages of another example method of formation. Referring to FIG. 4A, the microelectronic device 400 includes a die 402. The die 402 may be a portion of a workpiece containing additional devices, or may be a discrete workpiece containing only the die 402. The die 402 includes at least one I/O terminal 404. The I/O terminal 404 may have a composition similar to the compositions disclosed in reference to the I/O terminals 204 of FIG. 2A, that is, may include primarily aluminum or copper, and may have a cap layer or UBM layer of nickel, palladium, platinum, gold, or other metals.

A dielectric layer 406 is formed on the die 402. The dielectric layer 406 is formed to have a column trench 428 which exposes the I/O terminal 404. The dielectric layer is further formed to have a head trench 438 which opens onto the column trench 428. The dielectric layer 406 may have additional column trenches, not shown which expose additional I/O terminals, also not shown, and may have additional head trenches, not shown, which open onto the additional column trenches. At least a portion of the dielectric layer 406 may be formed by a first additive process, such as a directed energy process using a directed energy apparatus 458 to dispose dielectric material 456 onto the die 402, as depicted in FIG. 4A. The directed energy process delivers the dielectric material 456 in the form of microparticles or nanoparticles in an inter gas stream to the die 402, and uses directed thermal energy, for example, from a focused laser beam, to fuse the dielectric material 456 on the die 402. The dielectric layer 406 may include any of the materials disclosed in reference to the dielectric layer 306 of FIG. 3A, that is, may include organic polymer such as epoxy, BCB, polyimide, or acrylic, may include silicone polymer, or may include inorganic dielectric material such as silicon dioxide, silicon nitride, boron nitride, or aluminum oxide, optionally implemented as particles of the inorganic material, sintered or with a polymer binder.

Figure 4B:
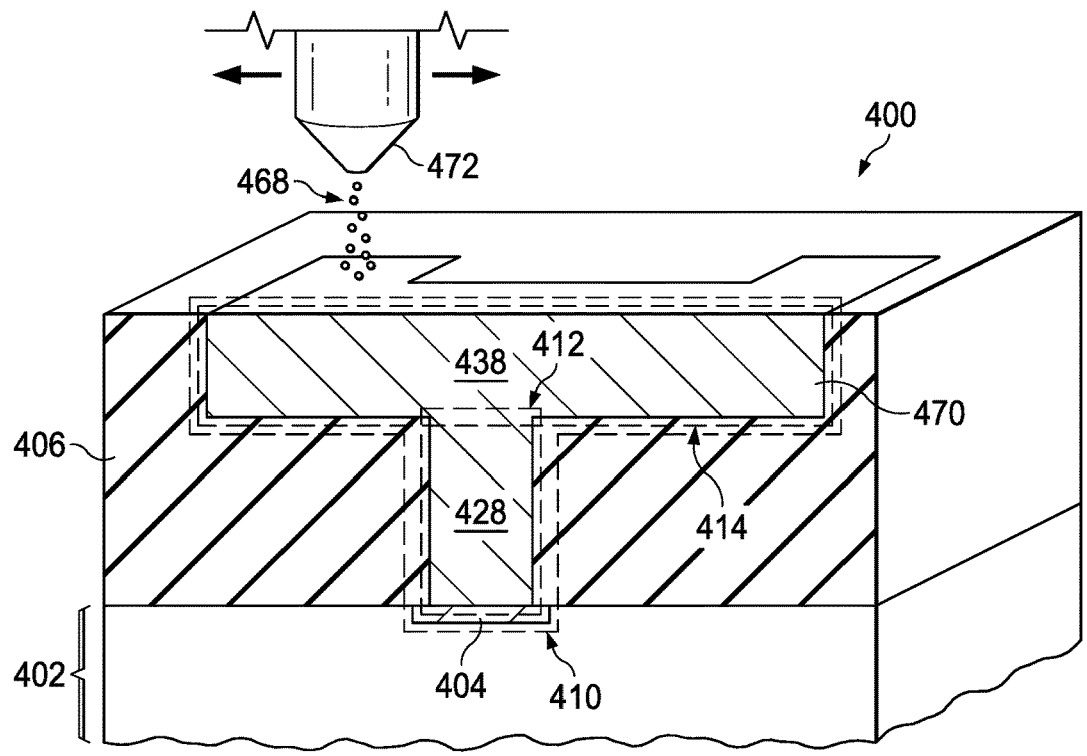

Referring to FIG. 4B, electrically conductive material 468 is disposed in the column trench 428 and in the head trench 438 to form at least a portion of a pillar conductor 470. The pillar conductor 470 in the column trench 428 provides a column 412 of a pillar 410 of the microelectronic device 400. The pillar conductor 470 in the head trench 438 provides a head 414 of the pillar 410. The electrically conductive material 468 may be disposed in the column trench 428 and the head trench 438 by a second additive process, such as an electrostatic deposition process using an electrostatic deposition apparatus 472, as depicted in FIG. 4B. Other additive processes may be used to form the column 412 and the head 414. The electrically conductive material 468 may include metal nanoparticles, such as copper, gold, silver, or aluminum nanoparticles. The electrically conductive material 468 may include carbon nanotubes, graphene, or other graphitic material. In one version of the instant example, the column 412 and the head 414 may be formed by separate additive processes using different electrically conductive materials. The column 412 or the head 414 may be heated to remove volatile material such as solvent or carrier fluid, to fuse electrically conductive particles of the electrically conductive material 468 together, or to melt metals in the electrically conductive material 468 to form an alloy in the column 412 or the head 414. Metal nanoparticles in the electrically conductive material 468 may be fused or melted at temperatures significantly lower than melting temperatures of bulk metals having a same composition, which may advantageously reduce thermal degradation of the microelectronic device 400.

Figure 4C:
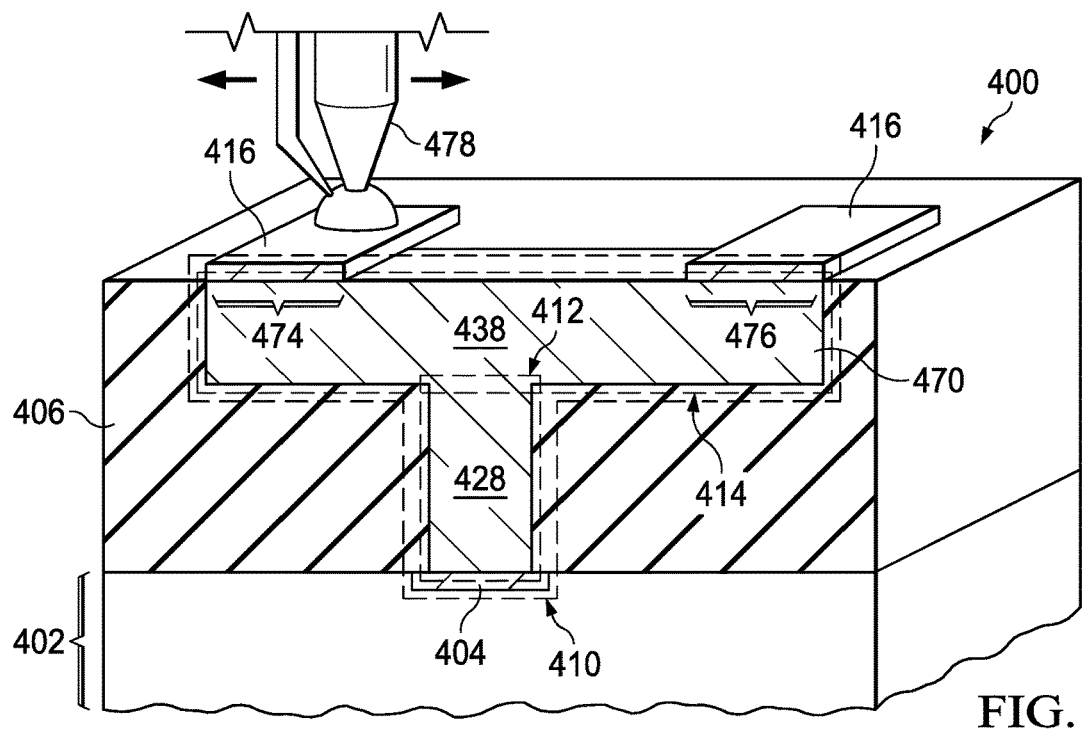

Referring to FIG. 4C, barrier layers 416 are formed on the head 414 in a first contact area 474 and in a second contact area 476. The barrier layers 416 may have compositions similar to the compositions disclosed for the barrier layers 116 of FIG. 1. The barrier layers 416 may be formed by a third additive process, such as an electrochemical deposition process using an electrochemical deposition apparatus 478, as depicted in FIG. 4C. The barrier layers 416 may be formed by other methods, such as sputtering thin films of barrier metals, followed by masking and etching. The barrier layers 416 are components of the pillar 410.

Figure 4D:
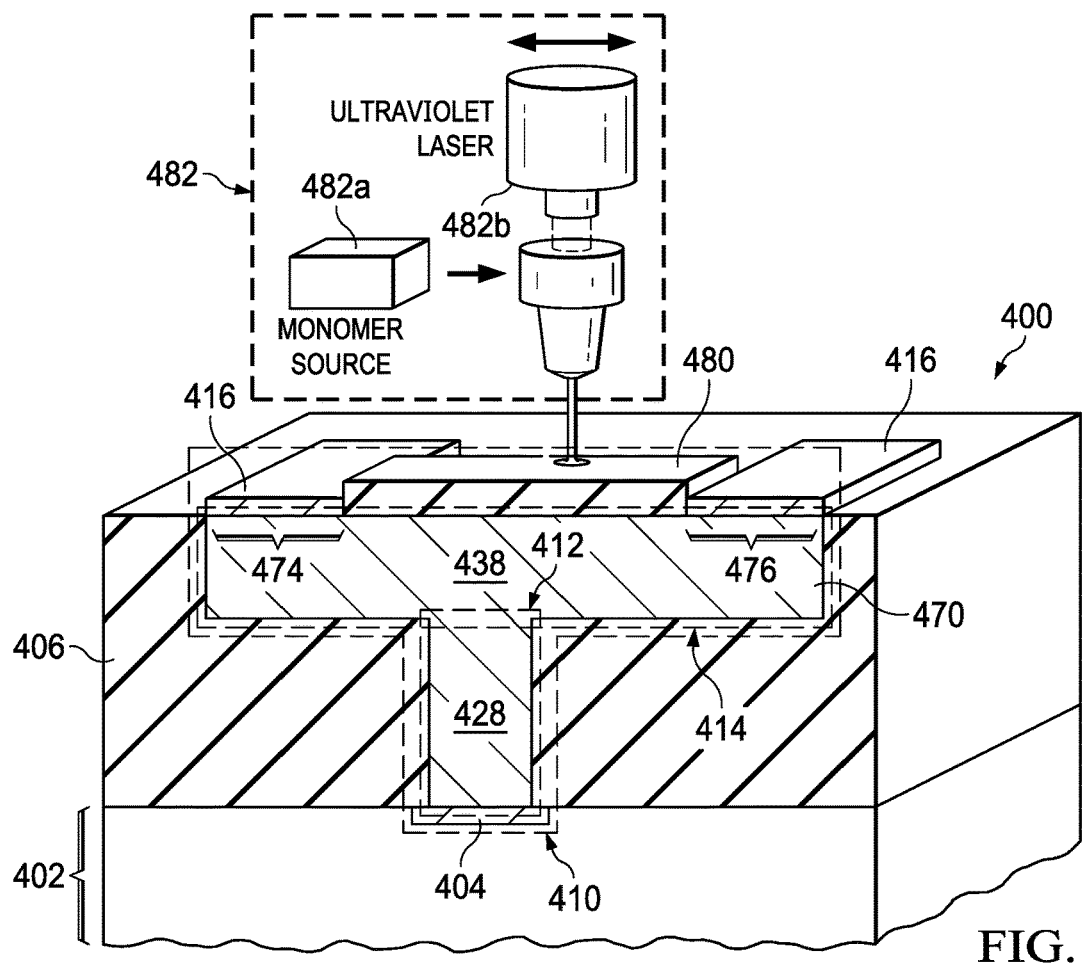

Referring to FIG. 4D, an isolation layer 480 is formed on the head 414, adjacent to the barrier layers 416. The isolation layer 480 may prevent unintended electrical contact to the head 414. The isolation layer 480 may include, for example, organic polymer material, silicone polymer material, inorganic material, or a combination thereof. The isolation layer 480 may be formed by a third additive process, such as a photo-polymerization extrusion process using a photo-polymerization extrusion apparatus 482 having a monomer source 482a, and an ultraviolet laser 482b. The isolation layer 480 is a component of the pillar 410.

Figure 4E:
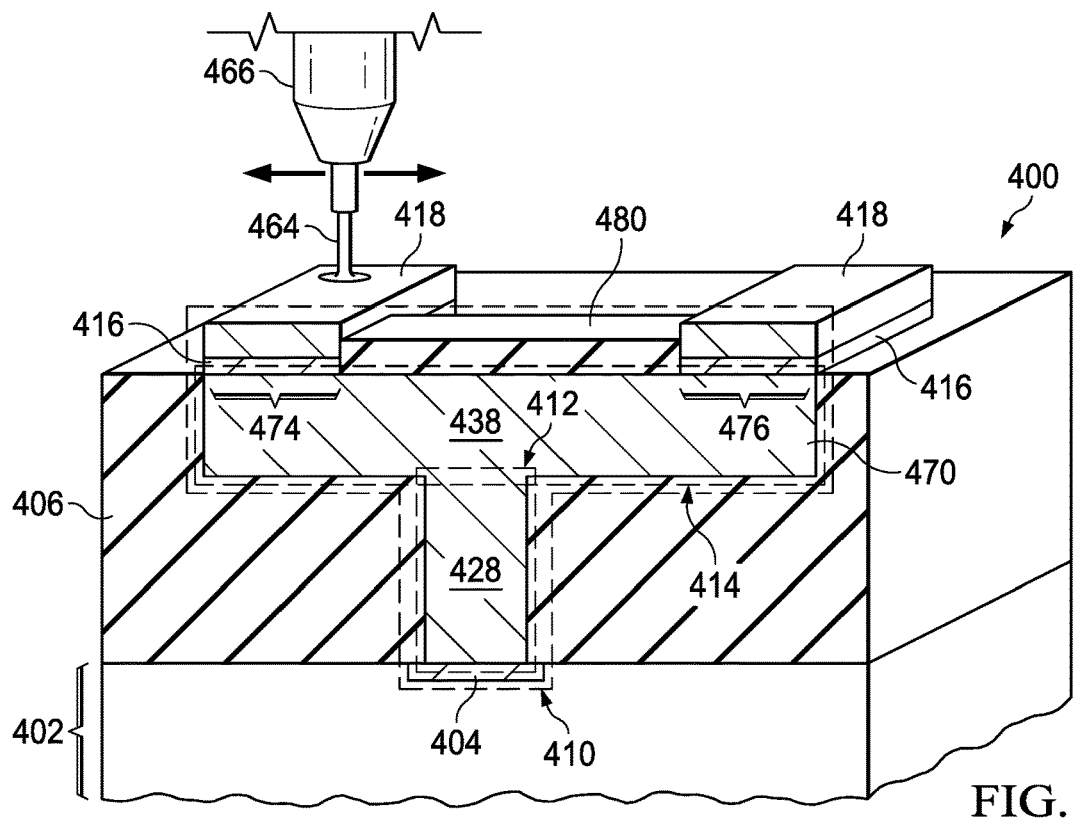

Referring to FIG. 4E, solder layers 418 may be formed on the barrier layers 416. The solder layers 418 may be formed by a fourth additive process, for example a material extrusion process which disposes solder paste 464 onto the barrier layers 416 using a material extrusion apparatus 466. The solder layers 418 may be heated, as disclosed in reference to FIG. 3E, that is, to remove volatile material or to reduce a resistance between the solder layer 418 and the barrier layer 416. The solder layers 418 are components of the pillar 410.

Figure 4F:
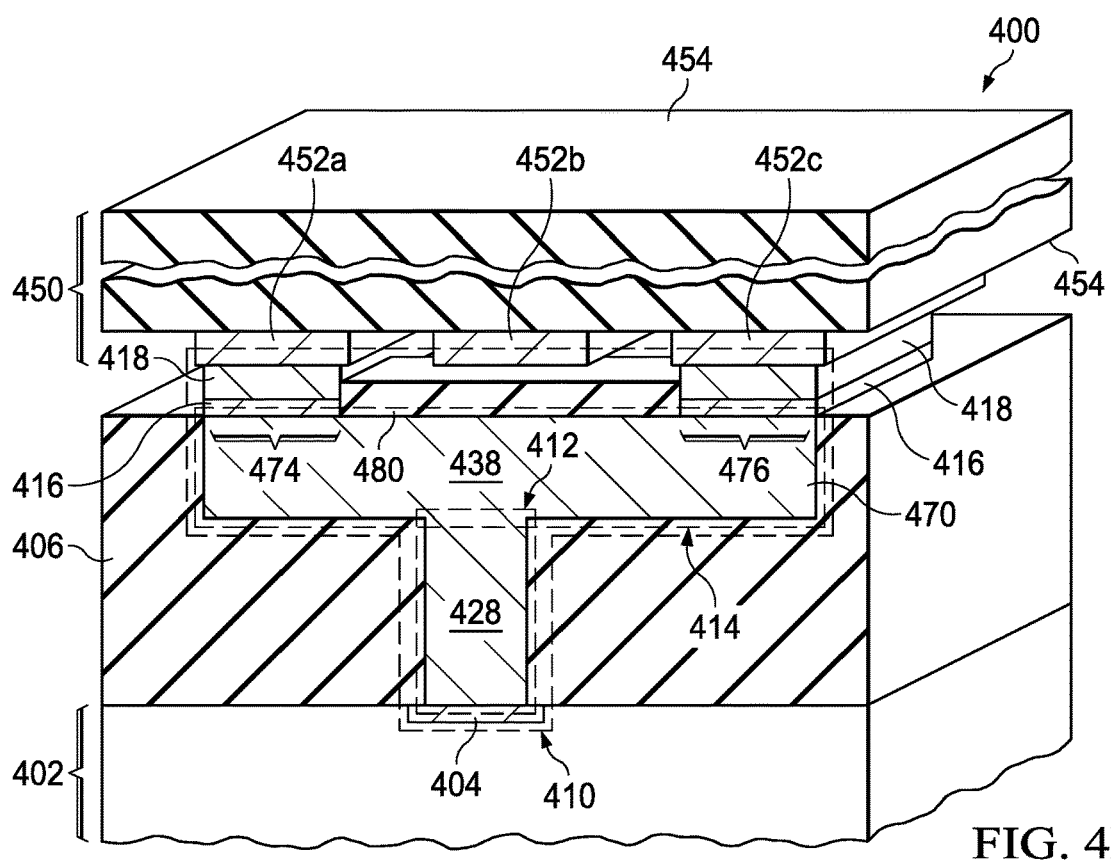

Referring to FIG. 4F, the microelectronic device 400 is assembled onto a circuit substrate 450. The circuit substrate 450 has an insulator layer 454 and pads 452a, 452b, and 452c, which are electrically conductive, on the insulator layer 454. The microelectronic device 400 is assembled onto the circuit substrate 450 by bringing the solder layers 418 into contact with the pads 452a and 452c, and heating the solder layers 418 to form solder connections between the pads 452a and 452c and the pillar 410 in the first contact area 474 and the second contact area 476, respectively. The isolation layer 480 may prevent electrical contact between the pad 452b and the head 414. The dielectric layer 406 may accrue advantages for the microelectronic device 400 similar to those disclosed in reference to FIG. 2L, that is, may provide support for the pillar 410 and provides protection for the die 402 during assembly to the circuit substrate 450, and afterward, during use of the assembled microelectronic device 400.

Figure 5A:
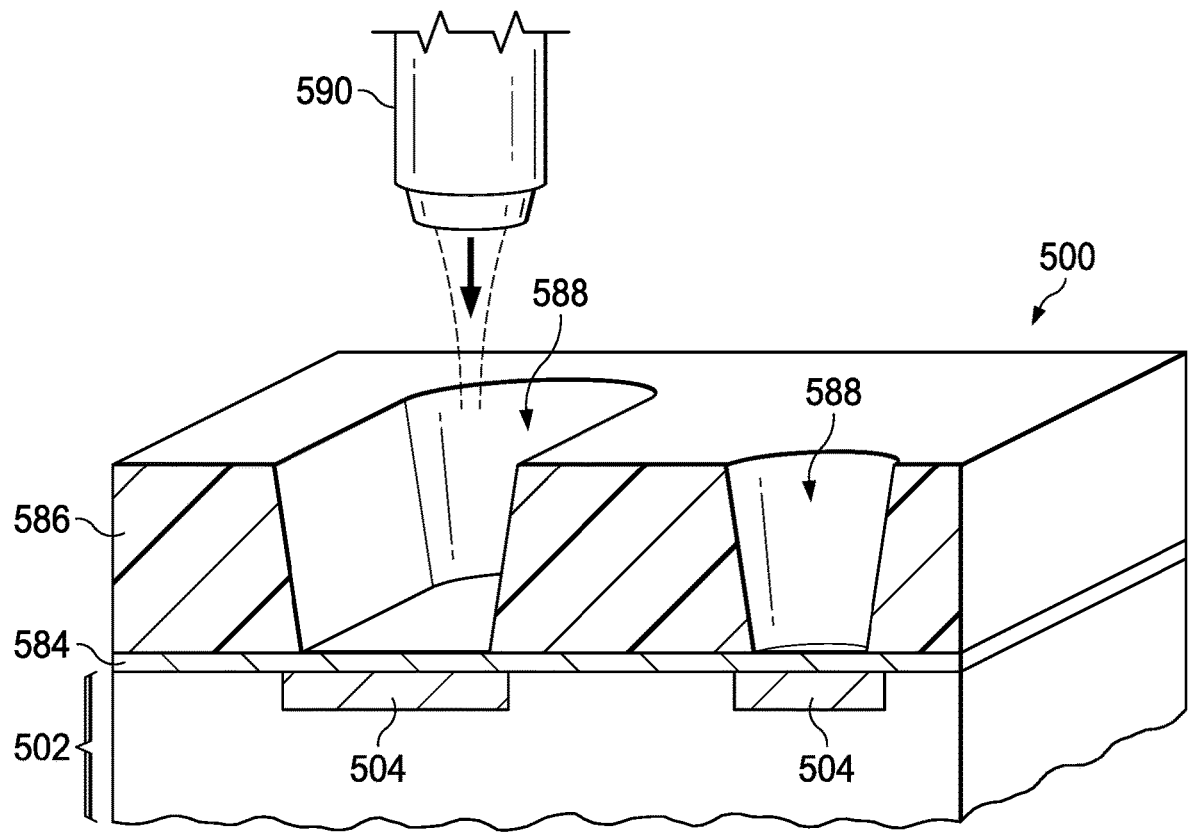
FIG. 5A through FIG. 5G are cross sections of a microelectronic device depicted in stages of another example method of formation.

FIG. 5A through FIG. 5G are cross sections of a microelectronic device depicted in stages of another example method of formation. Referring to FIG. 5A, the microelectronic device 500 includes a die 502. The die 502 includes I/O terminals 504. A seed layer 584 is formed over the die 502. The seed layer 584 is electrically conductive, and makes electrical contact with the I/O terminals 504. The seed layer 584 may include an adhesion sublayer with titanium, tungsten, or nickel, directly on the die 502. The seed layer 584 may include a plating surface sublayer with copper or nickel, to provide a suitable surface for an electroplating process.

A plating mask 586 is formed on the seed layer 584. The plating mask 586 has column openings 588 which expose the seed layer 584 over the I/O terminals 504. The column openings 588 may be tapered to be more narrow at an end of each column opening 588 that is proximate to the I/O terminals 504 and wider at an opposite end of each column opening 588 that is distal to the I/O terminals 504.

In one version of the instant example, the plating mask 586 may include organic polymer, and may be formed by forming a mask layer of the organic polymer on the seed layer 584. The column openings 588 may be formed in the mask layer by a laser ablation process using a scanned laser ablation apparatus 590. After formation of the column openings 588 is completed, the remaining mask layer provides the plating mask 586. Forming the column openings 588 with the tapered configuration of FIG. 5A may advantageously provide additional process latitude for the laser ablation process.

In another version, the plating mask 586 may include photoresist, photosensitive polyimide, or photosensitive silicone polymer, and may be formed by a photolithographic operation. Forming the column openings 588 with the tapered configuration may advantageously provide additional process latitude for the photolithographic operation. Alternatively, the plating mask 586 may be formed by an additive process, or a screen printing process.

Figure 5B:
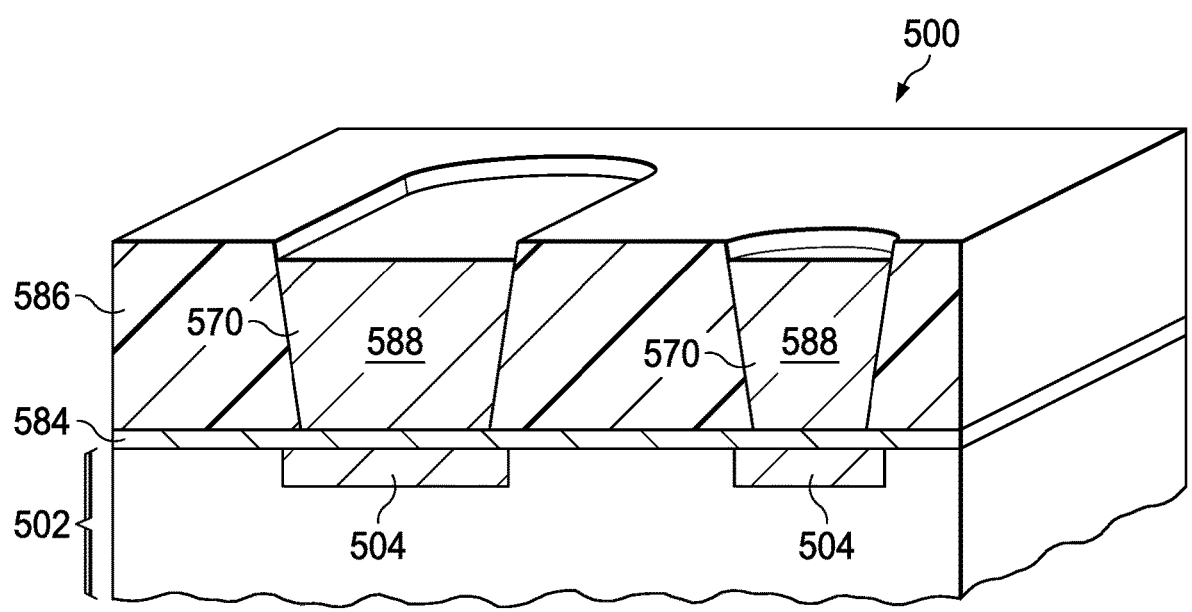

Referring to FIG. 5B, pillar conductors 570 are formed in the column openings 588 by an electroplating operation using the seed layer 584. The pillar conductors 570 may include, for example, copper, nickel, gold, silver, palladium, platinum, or tungsten. FIG. 5B depicts the pillar conductors 570 partway to completion by the electroplating operation.

Figure 5C:
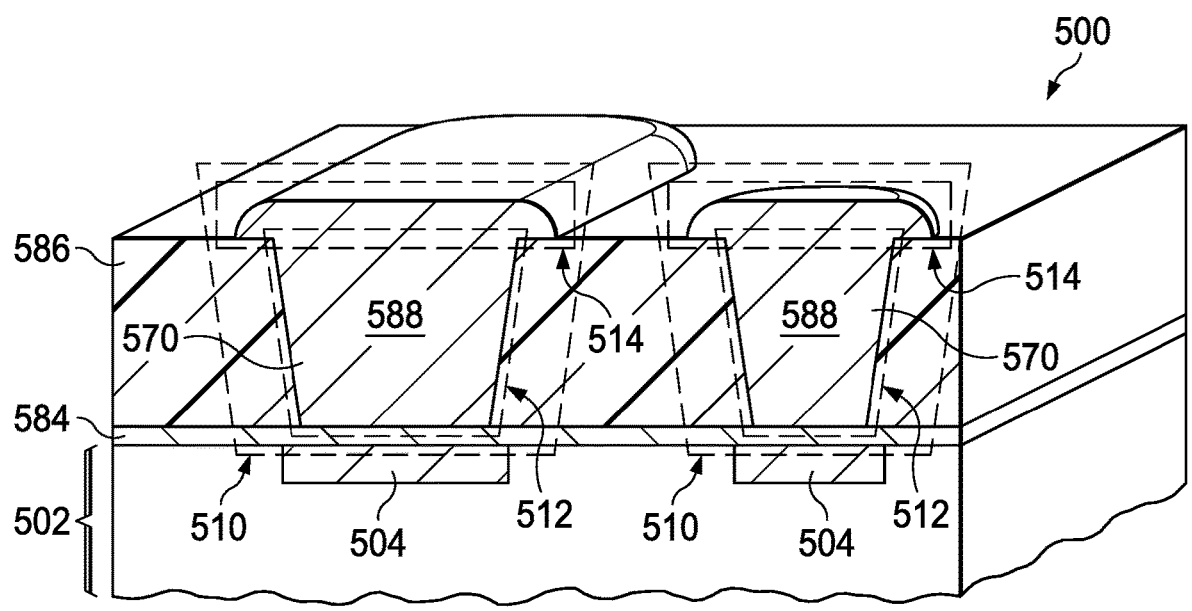

Referring to FIG. 5C, the electroplating operation is continued to complete the pillar conductors 570. The pillar conductors 570 of the instant example extend above and laterally past the column openings 588. Portions of the pillar conductors 570 in the column openings 588 provide columns 512 of pillars 510 of the microelectronic device 500. Portions of the pillar conductors 570 above the plating mask 586 provide heads 514 of the pillars 510.

Figure 5D:
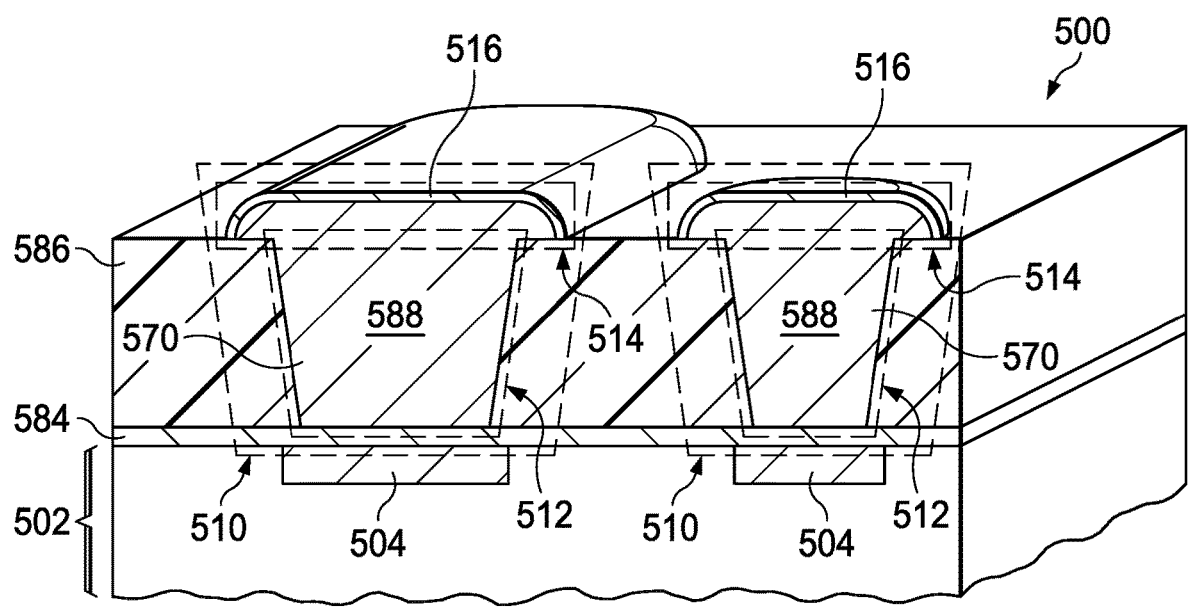

Referring to FIG. 5D, barrier layers 516 are formed on the heads 514. The barrier layers 516 may be formed, for example, by one or more electroplating processes using the seed layer 584, one or more electroless plating processes, by an additive process, or by sputtering thin films of barrier metals, followed by masking and etching. The barrier layers 516 may have compositions as disclosed in reference to the barrier layers 116 of FIG. 1. The barrier layers 516 are components of the pillars 510.

Figure 5E:
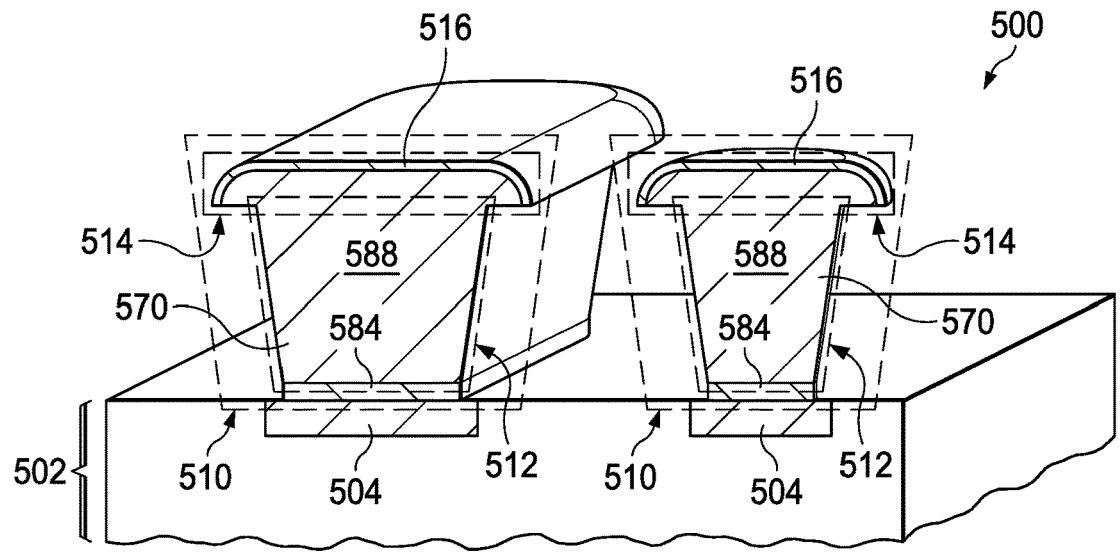

Referring to FIG. 5E, the plating mask 586 of FIG. 5D is removed. The plating mask 586 may be removed, for example, by an asher process using oxygen, an ozone process, a wet clean process using organic solvents, or a combination thereof. After the plating mask 586 is removed, the seed layer 584 is removed where exposed by the columns 512, leaving the seed layer 584 between the columns 512 and the I/O terminals 504. The seed layer 584 may be removed, for example, by a plasma etch process, a wet etch process, an electrochemical etch process (sometimes referred to as a reverse plating process), or a combination thereof. Portions of the seed layer 584 between the columns 512 and the I/O terminals 504 are components of the pillars 510.

Figure 5F:
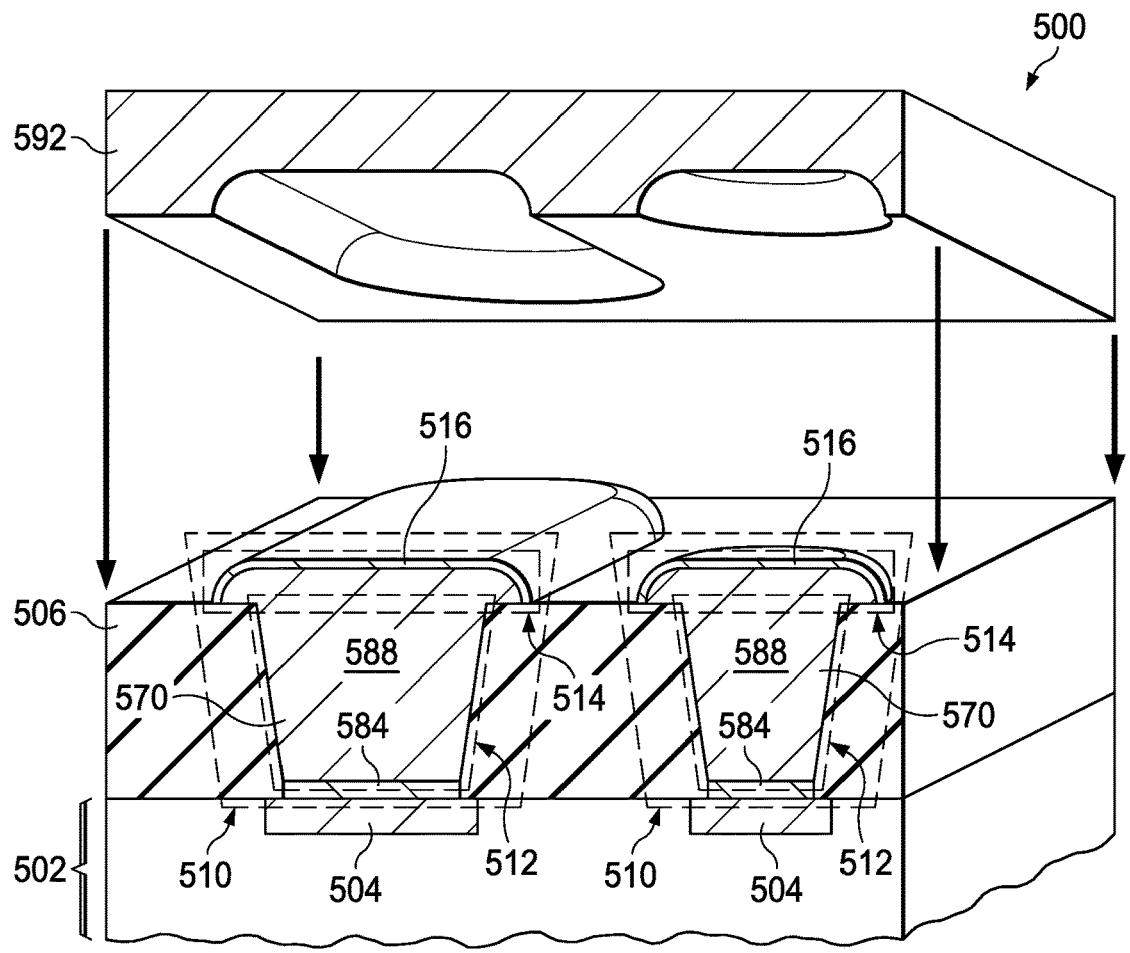

Referring to FIG. 5F, a dielectric layer 506 is formed on the die 502. The dielectric layer 506 may include any of the dielectric materials disclosed in reference to the dielectric layer 106 of FIG. 1. The dielectric layer 506 extends from the die 502 to the heads 514, and may optionally extend partway up lateral sides of the heads 514. The dielectric layer 506 may provide the advantages disclosed in reference to the dielectric layers 106, 206, 306, and 406 of the other examples herein, that is, that is, may provide support for the pillars 510 and provides protection for the die 502 during assembly, and afterward, during use of the assembled microelectronic device 500.

The dielectric layer 506 may be formed by a press mold process, in which dielectric material is disposed on the die 502 between the pillars 510 and subsequently molded into a desired configuration using a press mold plate 592. Other methods for forming the dielectric layer 506, such as a spin coat process followed by an etchback process, are within the scope of the instant example.

Figure 5G:
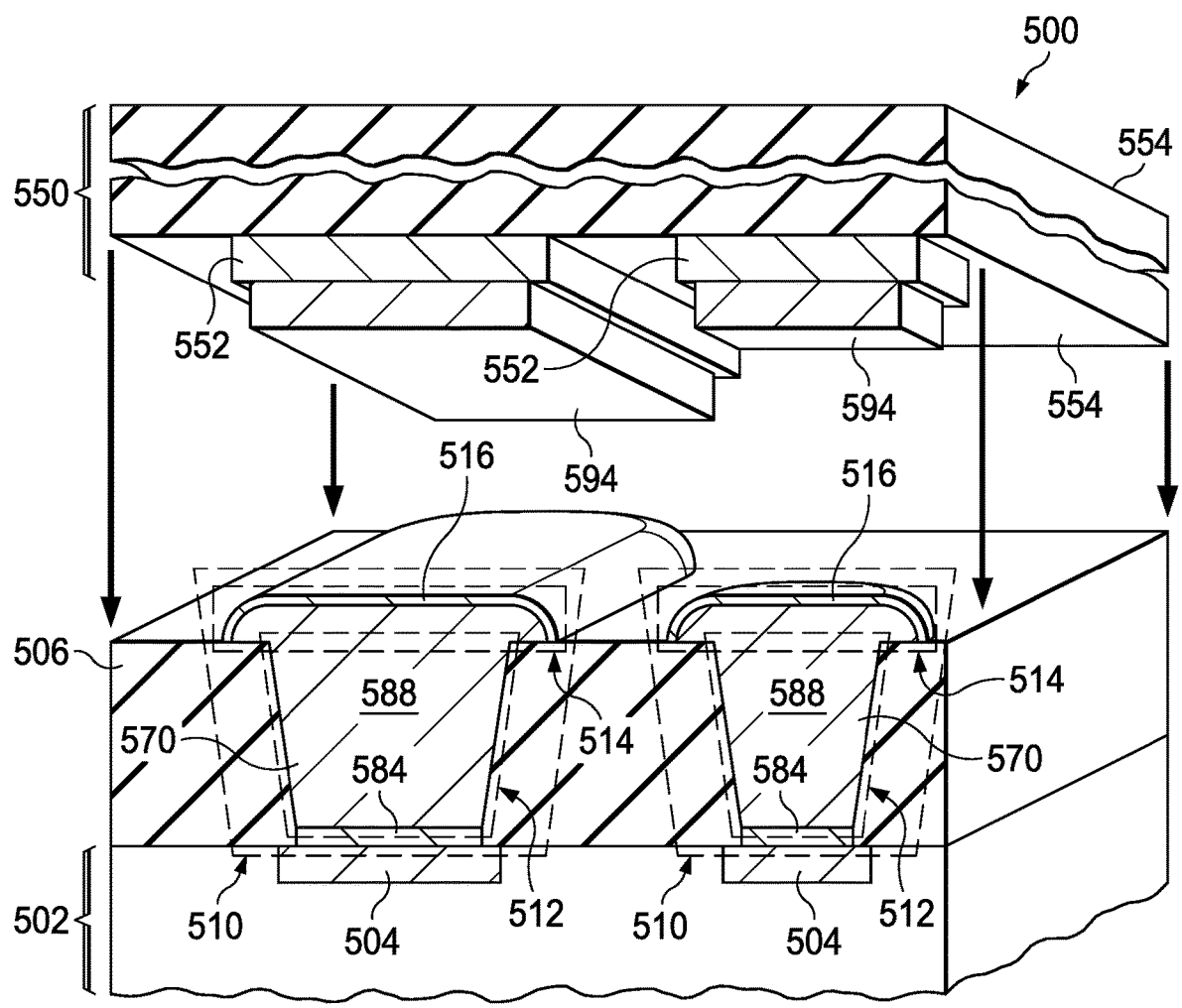

Referring to FIG. 5G, the microelectronic device 500 is assembled onto a circuit substrate 550. The circuit substrate 550 has an insulator layer 554 and pads 552. The pads 552 are electrically conductive. Solder preforms 594 may be disposed on the pads 552. The microelectronic device 500 is assembled by bringing the pillars 510 and the pads 552 into contact with the solder preforms 594, as indicated in FIG. 5G. The solder preforms 594 are heated to reflow the solder preforms 594, forming solder joints between the pillars 510 and the pads 552.

Various features of the examples disclosed herein may be combined in other manifestations of example integrated circuits. For example, the pillars 110 of FIG. 1 may be formed by any of the methods disclosed in reference to FIG. 2A through FIG. 2L, FIG. 3A through FIG. 3F, FIG. 4A through FIG. 4F, or FIG. 5A through FIG. 5F. Similarly, the dielectric layer 106 of FIG. 1 may be formed by any of the methods disclosed in reference to FIG. 2A through FIG. 2L, FIG. 3A through FIG. 3F, FIG. 4A through FIG. 4F, or FIG. 5A through FIG. 5F. Steps disclosed in reference to example methods herein for forming the dielectric layers 206, 306, 406, or 506, may be combined with steps disclosed in reference to other examples herein for forming the columns 212, 312, 412, or 512, and may further be combined with steps disclosed in reference to further examples herein for forming the heads 214, 314, 414, or 514.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
a die;
a first input/output (I/O) terminal and a second I/O terminal on the die;
a dielectric layer on the die;
a first column electrically coupled to the first I/O terminal and a second column electrically coupled to the second I/O terminal; and
a head electrically coupled to both the first column and the second column at an opposite end of each of the first and second columns from the first and second I/O terminals, the head extending through the dielectric layer, a portion of the head exposed from a surface of the microelectronic device, wherein the first I/O terminal and the second I/O terminal are on a same side of the die.

2. The microelectronic device of claim 1, wherein the head extends laterally past the first column in at least one lateral direction.

3. The microelectronic device of claim 1, further comprising a barrier layer on the portion of the head and a solder layer in contact with the barrier layer.

4. The microelectronic device of claim 3, wherein the barrier layer includes a metal selected from the group consisting of nickel, palladium, platinum, titanium, tantalum, cobalt, tungsten, molybdenum, and zinc.

5. The microelectronic device of claim 1, wherein a top surface of the microelectronic device and a surface along the portion of the head are coplanar.

6. The microelectronic device of claim 1, wherein:
the first column and the second column include copper; and
the head includes copper.

7. The microelectronic device of claim 1, wherein the first column and the second column include one of nickel, platinum, aluminum, tungsten, gold, graphene, or carbon nanotubes.

8. The microelectronic device of claim 1, wherein the dielectric layer includes photosensitive polymer material.

9. The microelectronic device of claim 1, wherein the first column and the second column include a column liner which is electrically conductive, extending around a lateral boundary of the first column and a lateral boundary of the second column, and the head includes a head liner which is electrically conductive, extending around a lateral boundary of the head.

10. An interconnect structure, comprising:
a dielectric layer;
a first column electrically coupled to a first contact on a die and a second column electrically coupled to a second contact on the die, the first contact and the second contact on a same side of the die; and
a head electrically coupled to both the first column and the second column at an opposite end of each of the first and second columns from the first and second contacts, the head extending through the dielectric layer, a portion of the head exposed from a surface of the dielectric layer.

11. The interconnect structure of claim 10, wherein the head extends laterally past the first column in at least one lateral direction.

12. The interconnect structure of claim 10, further comprising a barrier layer on the portion of the head and a solder layer in contact with the barrier layer.

13. The interconnect structure of claim 12, wherein the barrier layer includes a metal selected from the group consisting of nickel, palladium, platinum, titanium, tantalum, cobalt, tungsten, molybdenum, and zinc.

14. The interconnect structure of claim 10, wherein a top surface of the dielectric layer and a surface along the portion of the head are coplanar.

15. The interconnect structure of claim 10, wherein:
the first column and the second column include copper; and
the head includes copper.

16. The interconnect structure of claim 10, wherein the first column and the second column include one of nickel, platinum, aluminum, tungsten, gold, graphene, or carbon nanotubes.

17. The interconnect structure of claim 10, wherein the dielectric layer includes photosensitive polymer material.

18. The interconnect structure of claim 10, wherein the first column and the second column include a column liner which is electrically conductive, extending around a lateral boundary of the first column and a lateral boundary of the second column, and the head includes a head liner which is electrically conductive, extending around a lateral boundary of the head.

* * * * *